United States Patent
Kojima et al.

(10) Patent No.: US 6,275,431 B1
(45) Date of Patent: Aug. 14, 2001

(54) SEMICONDUCTOR MEMORY DEVICE HAVING BIT LINE PRECHARGE CIRCUITS ACTIVATED BY SEPARATE CONTROL SIGNALS AND CONTROL METHOD FOR THE SAME

(75) Inventors: Kazumi Kojima; Yasushige Ogawa, both of Kasugia (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/735,481

(22) Filed: Dec. 14, 2000

(30) Foreign Application Priority Data

Aug. 24, 2000 (JP) .................................................. 12-254108

(51) Int. Cl.$^7$ ........................................................ G11C 7/12
(52) U.S. Cl. .................... 365/203; 365/194; 365/189.11; 365/202
(58) Field of Search .................................... 365/203, 202, 365/194, 191, 189.11, 203.03

(56) References Cited

U.S. PATENT DOCUMENTS

| 5,602,795 | * | 2/1997 | Sandhu ............................. 365/230.06 |
| 5,896,334 | * | 4/1999 | Casper et al. ......................... 365/202 |
| 6,144,597 | * | 11/2000 | Kim ..................................... 365/201 |

FOREIGN PATENT DOCUMENTS

| 2245730 | * | 1/1992 | (GB) | ................................ G11C/7/00 |
| 5-94697 | * | 4/1993 | (JP) | ................................. G11C/11/41 |

* cited by examiner

*Primary Examiner*—Andrew Q. Tran
(74) *Attorney, Agent, or Firm*—Arent Fox Kintner Plotkin & Kahn, PLLC

(57) ABSTRACT

In a semiconductor memory device which is intended to lower the power consumption and raise the operation speed without increasing the circuit scale to meet trends toward the larger capacity, higher speed and, at the same time, the lower power voltage design, the precharge circuit Pre3 has its bit line shorting section formed of transistors TN1A and TN1B in series connection and its bit line voltage holding circuit formed of transistors TN2A and TN2B connected in series between the node of the transistors TN1A and TN1B and a precharge voltage VPR source, with the transistors TN1A and TN2A and the TN1B and TN2B being controlled by precharge signals BRS0 and BRS1, respectively. One of the precharge signals BRS0 and BRS1 is preset active since the former precharge operation cycle, the other precharge signal is activated to start the shorting operation of a bit line pair /BL-BL, and the preset precharge signal is deactivated to end the shorting operation.

9 Claims, 19 Drawing Sheets

BIT LINE PRECHARGE CIRCUIT OF THIRD EMBODIMENT OF THIS INVENTION

BIT LINE PRECHARGE CIRCUIT OF CONVENTIONAL SEMICONDUCTOR MEMORY DEVICE

WAVEFORMS OF CONVENTIONAL BIT LINE SHORTING OPERATION

FIG. 4   BIT LINE PRECHARGE CIRCUIT OF FIRST EMBODIMENT OF THIS INVENTION

OPERATIONAL WAVEFORMS OF FIRST EMBODIMENT OF THIS
INVENTION WITH REDUCED PRECHARGE TIME DUE TO CR DELAY

FIG. 7 BIT LINE PRECHARGE CIRCUIT OF SECOND EMBODIMENT OF THIS INVENTION

FIG. 8 OPERATIONAL WAVEFORMS OF SECOND EMBODIMENT OF THIS INVENTION WITH REDUCED PRECHARGE TIME DUE TO CR DELAY

FIG. 9 BIT LINE PRECHARGE CIRCUIT OF THIRD EMBODIMENT OF THIS INVENTION

FIG. 10 OPERATIONAL WAVEFORMS OF THIRD EMBODIMENT OF THIS INVENTION WITH REDUCED PRECHARGE TIME DUE TO CR DELAY

FIG. 11 BIT LINE PRECHARGE CIRCUIT OF FOURTH EMBODIMENT OF THIS INVENTION

FIG. 12 OPERATIONAL WAVEFORMS OF FOURTH EMBODIMENT OF THIS INVENTION

WAVEFORMS OF BIT LINE SHORTING OPERATION OF FOURTH EMBODIMENT

FIRST EXAMPLE OF BIT LINE PRECHARGE CIRCUIT OF FIFTH EMBODIMENT OF THIS INVENTION

SECOND EXAMPLE OF BIT LINE PRECHARGE CIRCUIT OF FIFTH EMBODIMENT OF THIS INVENTION

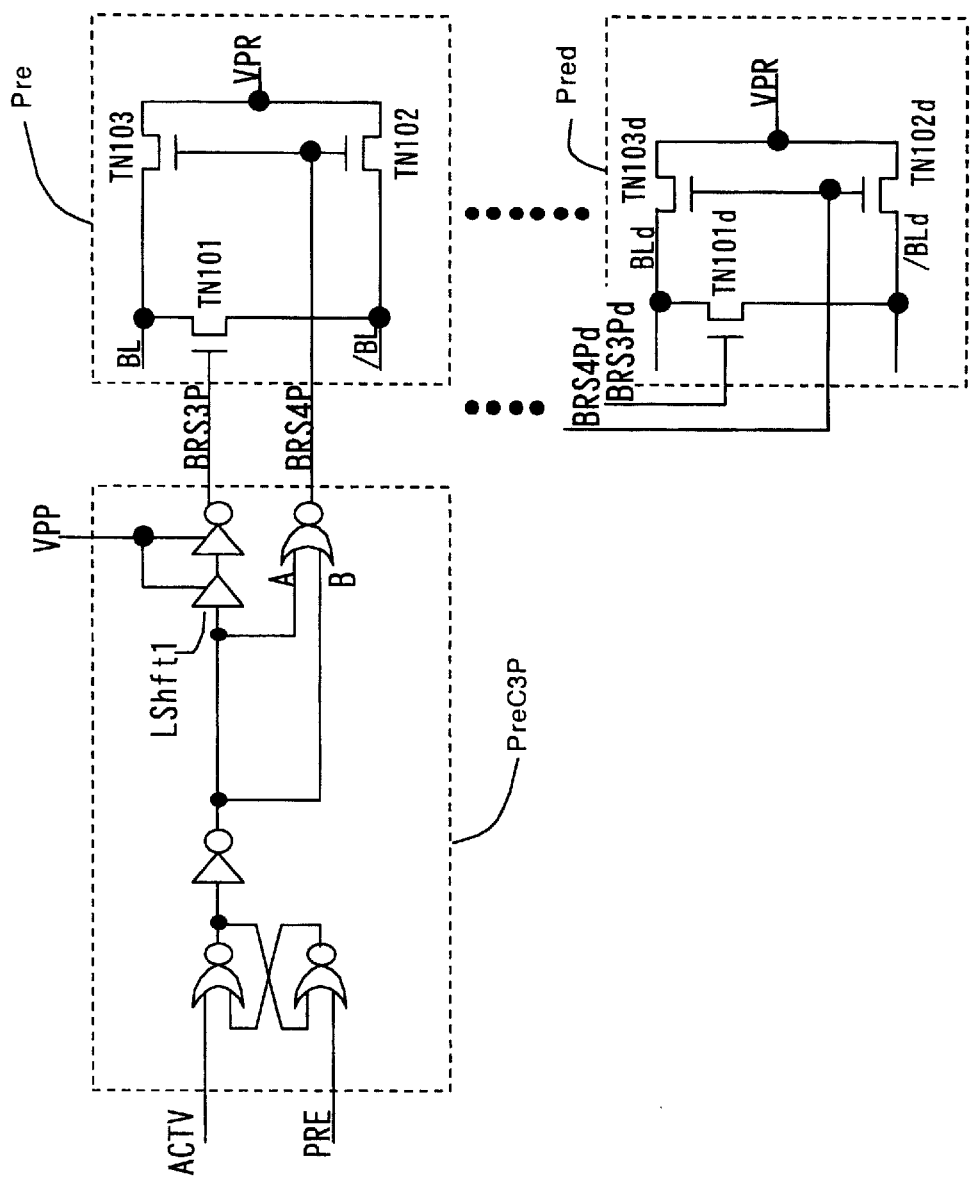
FIG. 16 FIRST EXAMPLE OF BIT LINE PRECHARGE CIRCUIT OF SIXTH EMBODIMENT OF THIS INVENTION

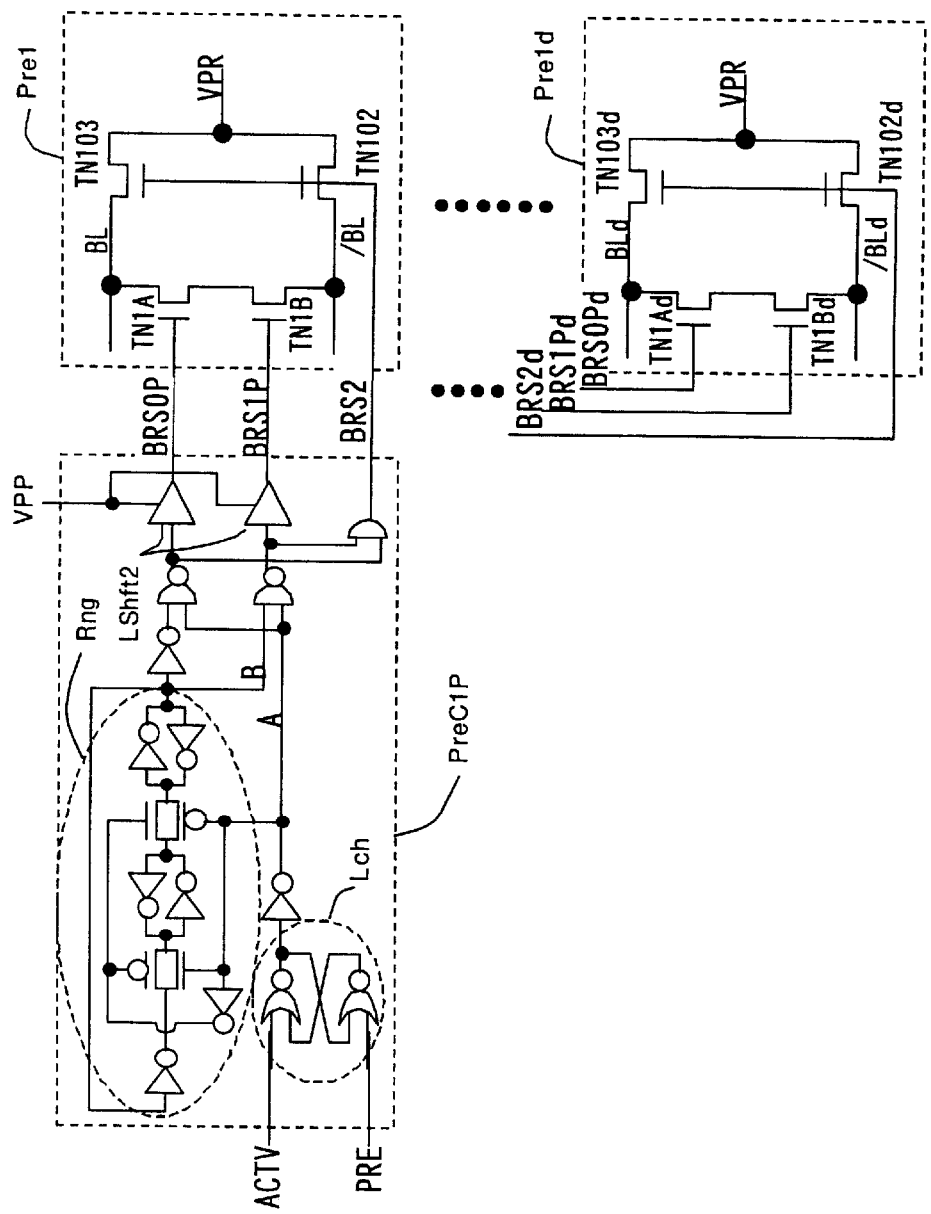
FIG. 17  SECOND EXAMPLE OF BIT LINE PRECHARGE CIRCUIT OF SIXTH EMBODIMENT OF THIS INVENTION

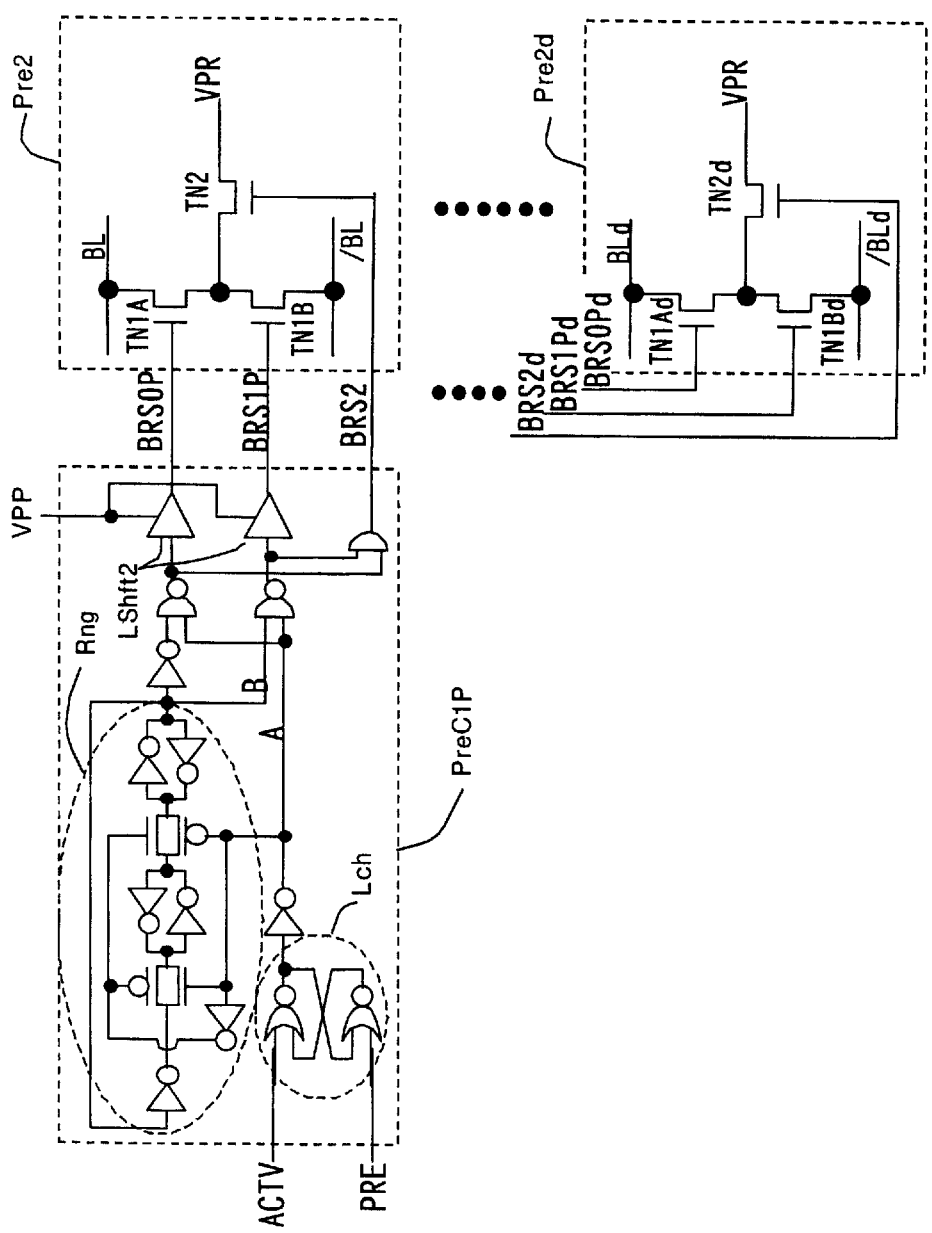
FIG. 18 THIRD EXAMPLE OF BIT LINE PRECHARGE CIRCUIT OF SIXTH EMBODIMENT OF THIS INVENTION

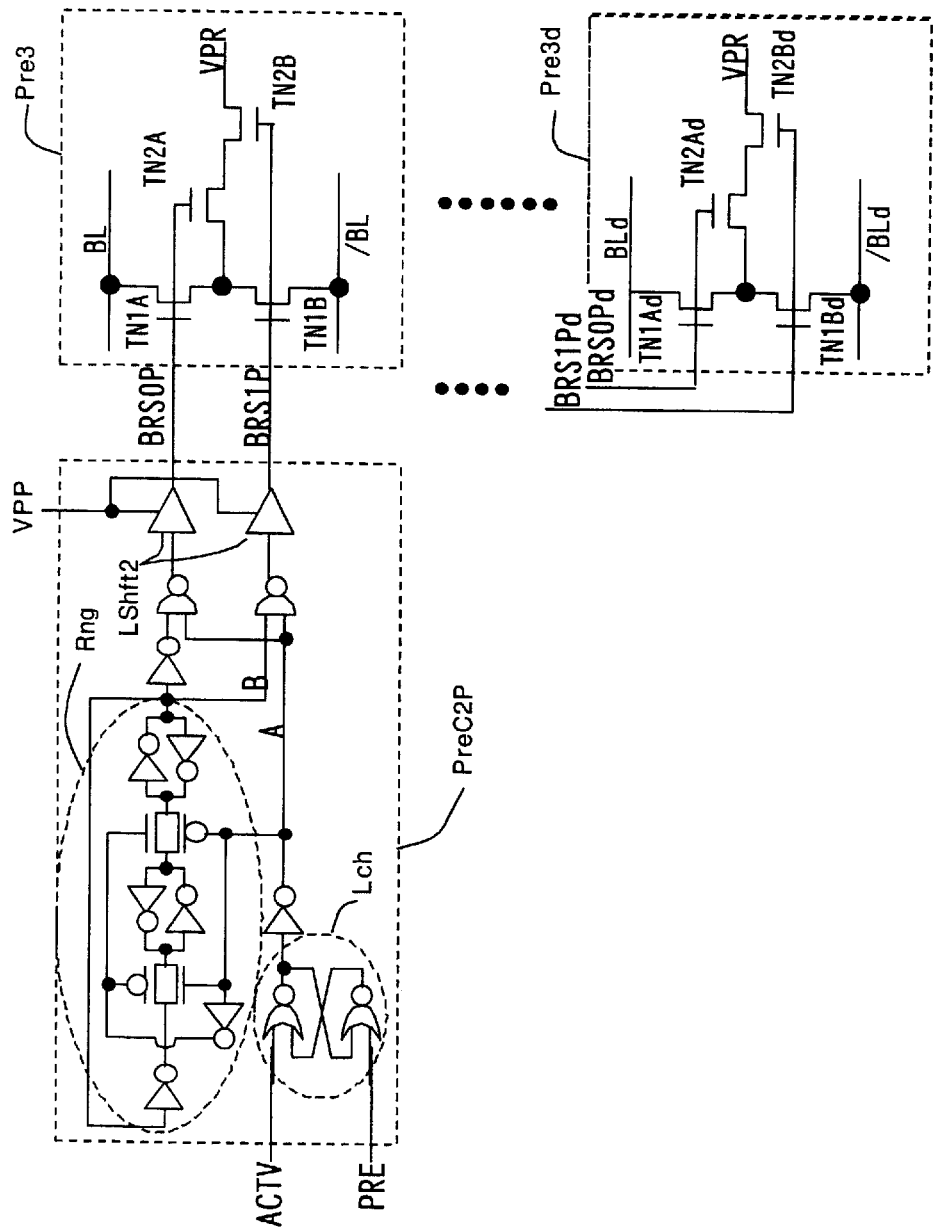
FIG. 19 FOURTH EXAMPLE OF BIT LINE PRECHARGE CIRCUIT OF SIXTH EMBODIMENT OF THIS INVENTION

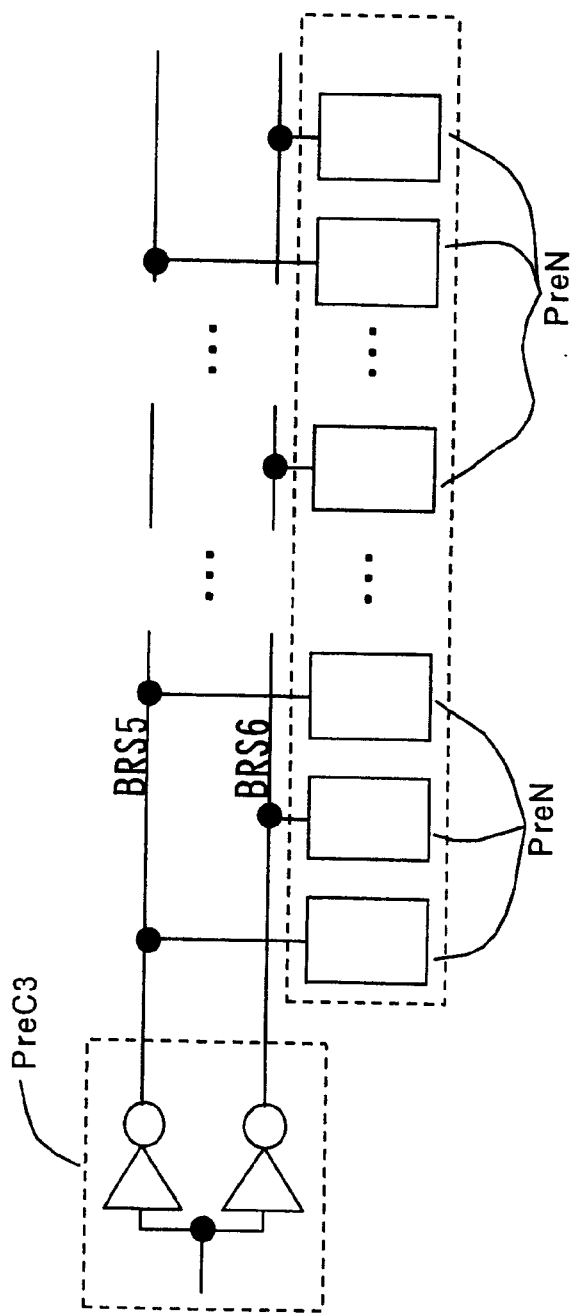
FIG. 20 BIT LINE DIVISIONAL PRECHARGING BASED ON SEVENTH EMBODIMENT OF THIS INVENTION

SEMICONDUCTOR MEMORY DEVICE HAVING BIT LINE PRECHARGE CIRCUITS ACTIVATED BY SEPARATE CONTROL SIGNALS AND CONTROL METHOD FOR THE SAME

BACKGROUND OF THE INVENTION

1. Field of the Invention

The present invention relates to a semiconductor memory device having a bit line precharge operation, and more particularly to a semiconductor memory device having a precharge operation which is intended for high-speed operation.

2. Description of Related Art

With the recent progress of computer technology which accomplishes animation pictures and other innovative functions, there are intense demands of the larger storage capacity and higher operating speed of semiconductor memory devices such as DRAM (dynamic random access memory). Other requirements which owe to the progress of process technology include the lower power voltage operation and lower power consumption for prevailing portable electronic appliances.

In regard to the data transaction with memory cells which takes place through bit lines, particularly in the case of data readout, a pair of bit lines are laid on both sides of a sense amplifier which implements the differential amplification for the complementary signals of data which is read out of a memory cell. After a data access, the bit line pair need to have the precharge operation for resetting their voltage preparatory to the next data access. The cycle time of data input/output is determined from the sum of the time of data access operation and the time of bit line precharge operation. Accordingly, for speeding up data access, it is crucial to speed up the bit line precharge operation.

FIG. 1 shows the bit line precharge circuit of the conventional semiconductor memory device. In the figure, memory cell Cell-0 and Cell-1 (these are memory cells of DRAM) represent numerous memory cells which are connected between a bit line pair /BL and BL. The bit line pair /BL-BL are further connected to a sense amplifier Samp and a precharge circuit Pre.

The precharge circuit Pre is made up of a transistor TN101 which shorts the bit line pair /BL-BL, and transistors TN102 and TN103 which hold the voltage of the shorted bit line pair /BL-BL at a precharge voltage VPR. These transistors TN101-TN103 are controlled by a precharge signal PREZ which is produced by a precharge signal generation circuit PreC, which is controlled by a data cycle start signal ACTV and precharge cycle start signal PRE provided by a control circuit Cnt.

In order to speed up the precharge operation to meet trends toward the larger storage capacity and lower power voltage operation, the precharge signal PREZ has been devised to gain its driving power. Specifically, the precharge signal generation circuit PreC is configured with high-power transistors so as to match with the total gate capacitance of many sets of transistors TN101–TN103 within the chip, or it is supplied with a higher voltage VPP so as to deal with an increased load resulting from a larger number of transistors TN101–TN103 to drive and a degraded driving power due to the lower power voltage.

However, the demand of the larger storage capacity and higher operating speed is ever growing, which is backed by the progress of low voltage design, and therefore the above-mentioned conventional control circuit increases in its scale on the chip and in its power consumption, while it is still deficient in high-speed performance, as will be described in detail later.

In the case of an increased storage capacity as shown in FIG. 2, the precharge circuits Pre in connection with the precharge signal (PREZ) line have an increased number of sets of transistors TN101–TN103, and the resistance of the PREZ line and the gate capacitance of the transistors TN101–TN103 create CR delays of individual bit line pairs. The CR delay cumulates at each crossing of bit line pair and reaches the maximum value at the farthest bit line pair, and the precharge operation of the memory device as the whole completes only at the end of the latest operation for the farthest bit line pair. The CR time constant which is a key factor of speed-up is determined by the line resistance and gate capacitance, which is beyond the enhanced driving power of the precharge signal generation circuit PreC.

For coping with an increased load capacitance for the precharge signal PREZ due to the larger storage capacity, it is necessary to use larger transistors in the precharge signal generation circuit PreC thereby to gain the driving power of the precharge signal PREZ, however, it adversely results in an increased area of the circuit PreC on the chip against the intention of the higher circuit integration.

The enhancement of output power of the precharge signal generation circuit PreC and the addition or enhancement of power of the voltage step-up circuit for the high-VPP drive of the precharge signal PREZ increase the power consumption against the intention of the lower power voltage.

Due to the progress of process technology and the popularization of portable electronic appliances, in transistor technology, low power design of power voltage has made greater progress than that of threshold voltage has made. As a result, operational margin of transistors against the power voltage VDD tends to reduce. On this account, in order to read data out of memory cells correctly, with the bit line pair /BL-BL being precharged by the conventional precharge circuit Pre, it becomes necessary to short the bit line pair /BL-BL thoroughly, which takes a longer precharge time before proceeding to the next data access operation against the intention of the higher-speed operation.

This affair will be explained more specifically with reference to FIG. 3. The precharge signal PREZ rises to the high level, causing the transistors TN101–TN103 to become conductive, and the precharge operation begins. In this state, the transistors TN101–TN103 have different back bias levels and therefore have different driving power.

Assuming that the bit line BL has a voltage of VDD, the bit line /BL has a voltage of 0 V and the precharge voltage VPR is VDD/2, there is the following bias voltage relation among the transistors at time point t0.

TN101: VGS=VDD, VDS=VDD, VBS=0
TN102: VGS=VDD, VDS=VDD/2, VBS=0
TN103: VGS=VDD/2, VDS=VDD/2, VBS=VDD/2

At a time point between t0 and t1, the transistor TN101 becomes conductive deepest among the transistors due to the bias relation to begin to short the bit line pair /BL-BL. The transistor TN102 becomes conductive deeply next to short the bit line /BL (0 V) to the precharge voltage VPR (i.e., VDD/2), and the transistor TN103 shorts the bit line BL (VDD) to the precharge voltage VPR (i.e., VDD/2) weaker than the transistor TN102. At time point t1, the bit line BL has VPR+α and the /BL has VPR, with these transistors having the following bias voltage conditions.

TN101: VGS=VDD/2, VDS=αVBS=VDD/2

TN102: VGS=VDD/2, VDS=0, VBS=VDD/2

TN103: VGS=VDD/2, VDS=αVBS=VDD/2

At time point t1, the transistors TN101 and TN103 conduct currents to short the bit lines, whereas the transistor TN102 having VDS=0 does not conduct a current. At time point between t1 and t2, the transistor TN101 keeps to short the bit line pair /BL-BL, which are then pulled to a voltage level of VDD/2+α2. At time point t2, the bias voltage conditions become as follows.

TN101: VGS=VDD-(VDD/2+α2), VDS=0, VBS=VDD/2+α2

TN102: VGS=VDD/2, VDS=α2, VBS=VDD/2

TN103: VGS=VDD/2, VDS=α2, VBS=VDD/2

Finally, the bit lines /BL and BL will have their voltage level approaching to VPR (i.e., VDD/2).

The above-mentioned α is a constant determined from the circuit parameters, and it has a small value when the transistors TN101–TN103 have a sufficient driving power for the precharge operation, making the voltage difference of the bit lines /BL and BL at time point t1 to be negligible for the sense amplifier SAmp. However, in terms of progress in low power voltage design for transistors, low voltage design level of threshold voltage has not kept pace up with that of power voltage, wherein threshold voltage seems to rise relatively higher compared with the low power voltage. Therefore, when the transistors TN101–TN103 have little operational margin, which is due to the relatively rising threshold voltage, the a has a significant value, by which the sense amplifier SAmp cannot operate normally any longer at time point t1, and the need of elongated precharge time will retard the speed-up of data access.

SUMMARY OF THE INVENTION

The present invention is intended to solve the foregoing prior art deficiency, and its prime object is to provide a semiconductor memory device which is capable of fully achieving the low-power and high-speed operation without increasing the circuit scale to meet trends toward the larger capacity, higher speed and, at the same time, the lower power voltage design.

In order to achieve the above objective, the semiconductor memory device based on one aspect of this invention has its bit line shorting circuit configured with a first and second switching elements which are connected in series between each pair of bit lines.

In this semiconductor memory device, the first and second switching elements are controlled to become conductive by a first and second control signals which do not have a simultaneous signal level transition, and the bit line pair is shorted when both control signals in unison turns on these switching elements. Specifically, one of the first and second control signals is preset to the active level prior to the bit line shorting operation, the other control signal is activated to start the bit line shorting operation, and the preset control signal is deactivated to terminate the shorting operation.

Accordingly, the bit line shorting operation can start and end in response to the different control signals, and even if the control signals have their waveforms dulled by the CR delay of the signal line, the normal precharge operation can take place in a short time even in the case of speed-up of data access. Namely, this circuit arrangement is less susceptible to the CR delay which is attributable to the line resistance of the control signal line and the load capacitance of the first and second switching elements, and is capable of reducing the shorting time of bit line pairs, thereby accomplishing high-speed data access.

In addition, these control signals need not be short pulses, and the control signal generation circuit can have a smaller driving power as compared with the conventional circuit arrangement, and consequently can reduce the area on the chip and also the power consumption.

The semiconductor memory device based on another aspect of this invention has its bit line shorting circuit configured with a sixth switching element which is connected between each pair of bit lines and its bit line voltage holding circuit configured with a seventh switching element which is connected between one bit line of the bit line pair and a voltage source of a certain voltage.

In this semiconductor memory device, the sixth switching element is controlled by a fourth control signal to short the bit line pair, and on expiration of a certain delay time when the voltages of both bit lines approach due to shorting, one bit line is held to a certain voltage directly by the seventh switching element which is controlled by a fifth control signal and the other bit line is held to the voltage through the sixth switching element.

Consequently, based on the intentional use of the delay time to activate the seventh switching element when the voltages of both bit lines approach due to shorting, it is possible to hold the voltage of the bit lines based on the minimal circuit of the seventh switching element regardless of whichever is one bit line connected directly by the seventh switching element or the other bit line connected through the sixth switching element, whereby it becomes possible to reduce the number of component parts of the bit line voltage holding circuit and speed up the operation based on a resulting reduced load to the switching elements.

The control method of semiconductor memory device based on still another aspect of this invention is to produce multiple separate control signals from one control signal and control a series of operations sequentially beginning with the bit line shorting operation up to the bit line voltage holding operation based on these separate control signals.

In this semiconductor memory device control method, the separate control signals control the bit line shorting operation and voltage holding operation on a step by step basis so that each control signal has a confined load, whereby the difference in propagation delay time among the separate control signals can be reduced and the semiconductor memory device can have a high-speed operation without increasing the scale of the control signal producing circuit.

The above and further objects and novel features of the invention will more fully appear from following detailed description when the same is read in connection with the accompanying drawings. It is to be expressly understood, however, that the drawings are purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 16 is a schematic circuit diagram showing a first specific example of the bit line precharge circuit based on a sixth embodiment of this invention;

FIG. 17 is a schematic circuit diagram showing a second specific example of the bit line precharge circuit based on the sixth embodiment of this invention;

FIG. 18 is a schematic circuit diagram showing a third specific example of the bit line precharge circuit based on the sixth embodiment of this invention;

FIG. 19 is a schematic circuit diagram showing a fourth specific example of the bit line precharge circuit based on the sixth embodiment of this invention; and FIG. 20 is a schematic circuit diagram showing the bit line divisional precharging for the semiconductor memory device based on a seventh embodiment of this invention.

DETAILED DESCRIPTION OF THE PREFERRED EMBODIMENTS

Figure 1:
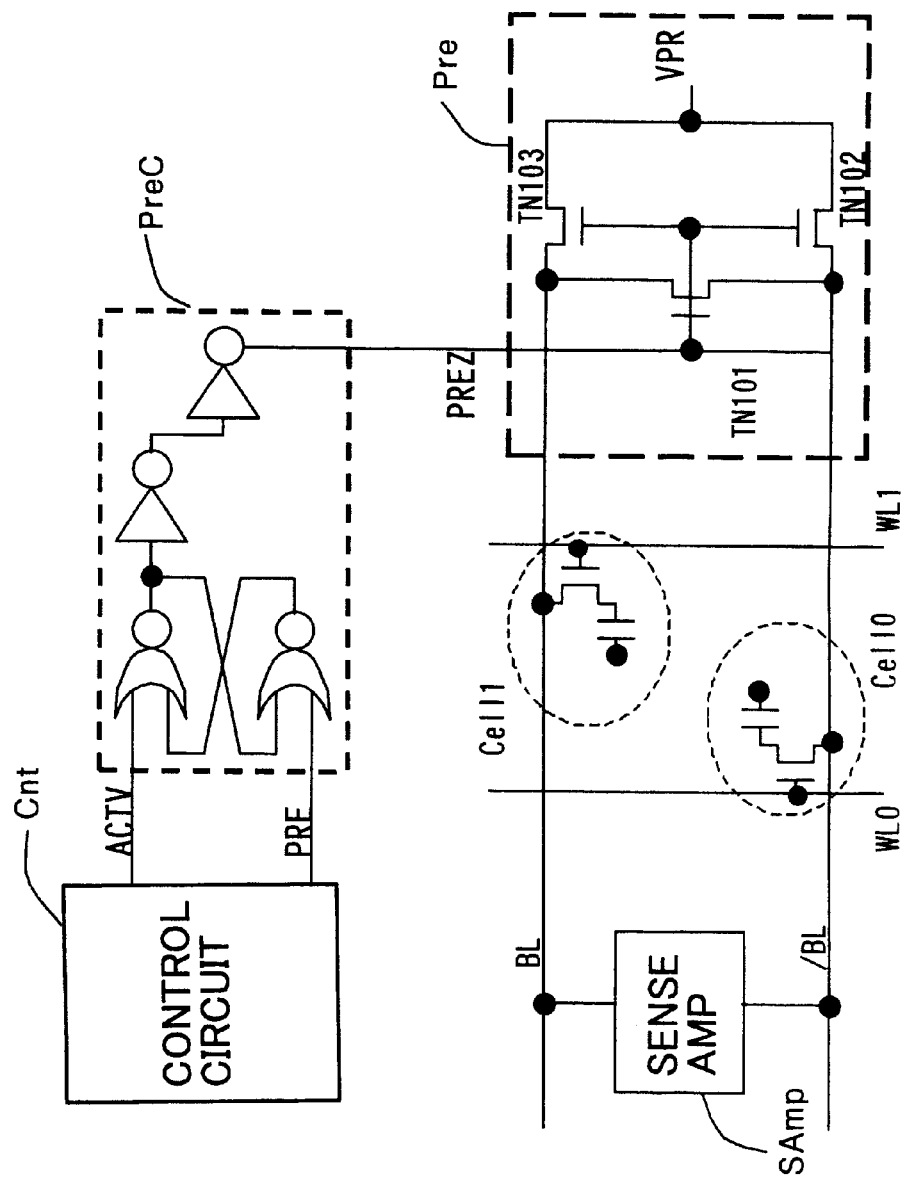
FIG. 1 is a schematic circuit diagram showing the bit line precharge circuit of the conventional semiconductor memory device.
Figure 2:
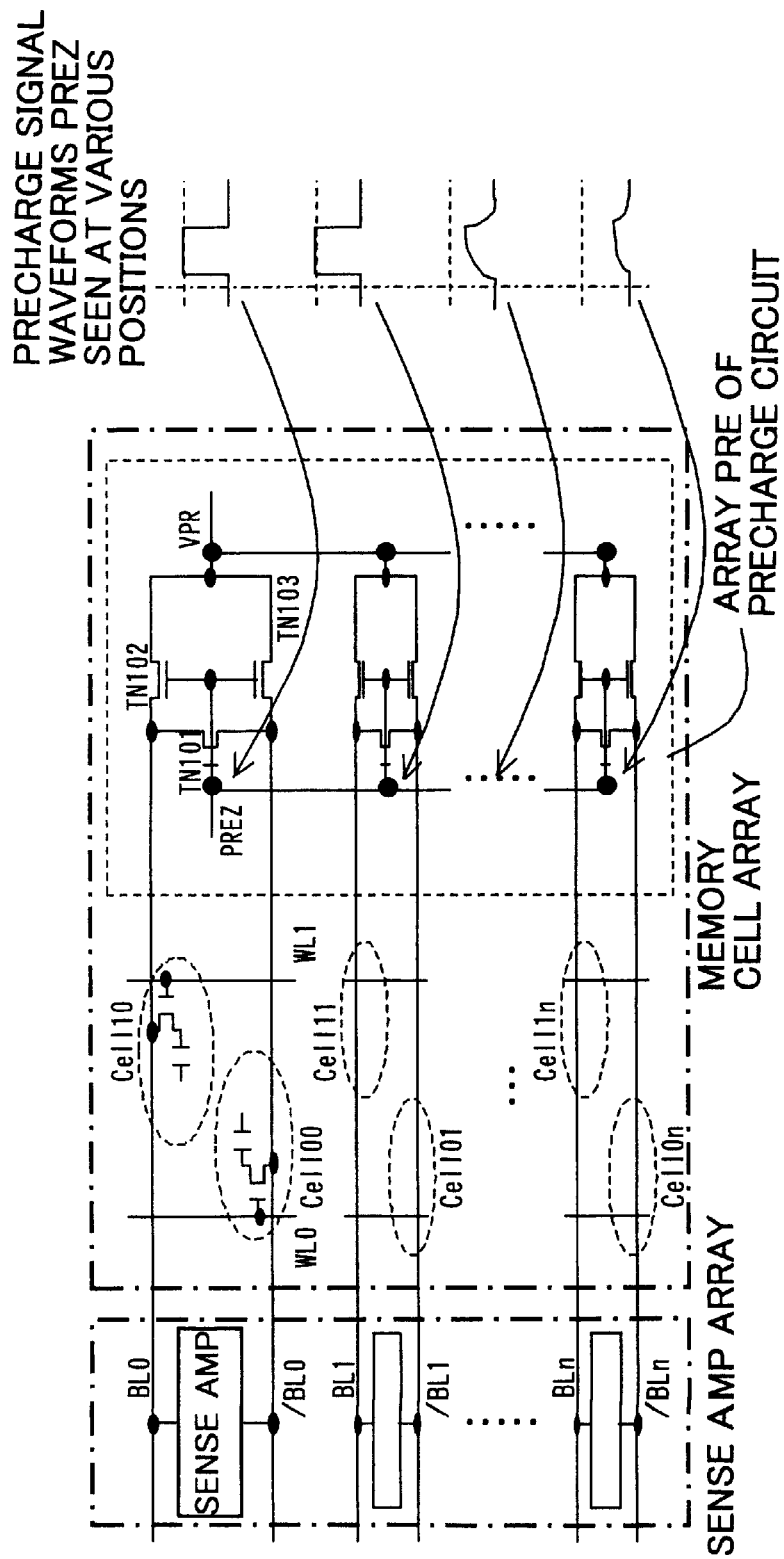
FIG. 2 is a schematic circuit diagram showing in brief the memory cell array and bit line precharge circuits of the conventional semiconductor memory device, and also showing the delay and waveform distortion of the precharge signal.
Figure 3:
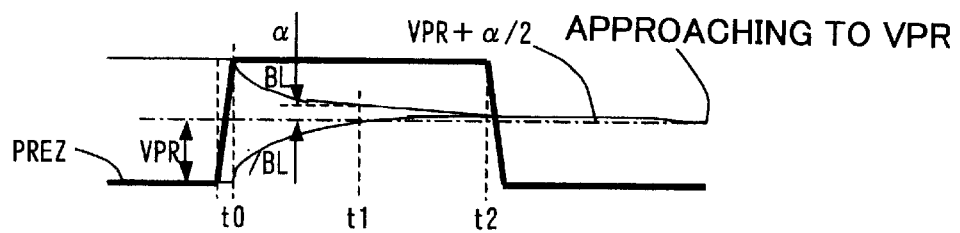
FIG. 3 is a waveform diagram showing the bit line shorting operation of the conventional circuit arrangement.

The first through seventh embodiments of the semiconductor memory device based on this invention will be explained in detail with reference to FIG. 4 through FIG. 20. Throughout the drawings, component parts identical to those of the foregoing conventional circuit arrangement are referred to by the common reference numerals.

Figure 4:
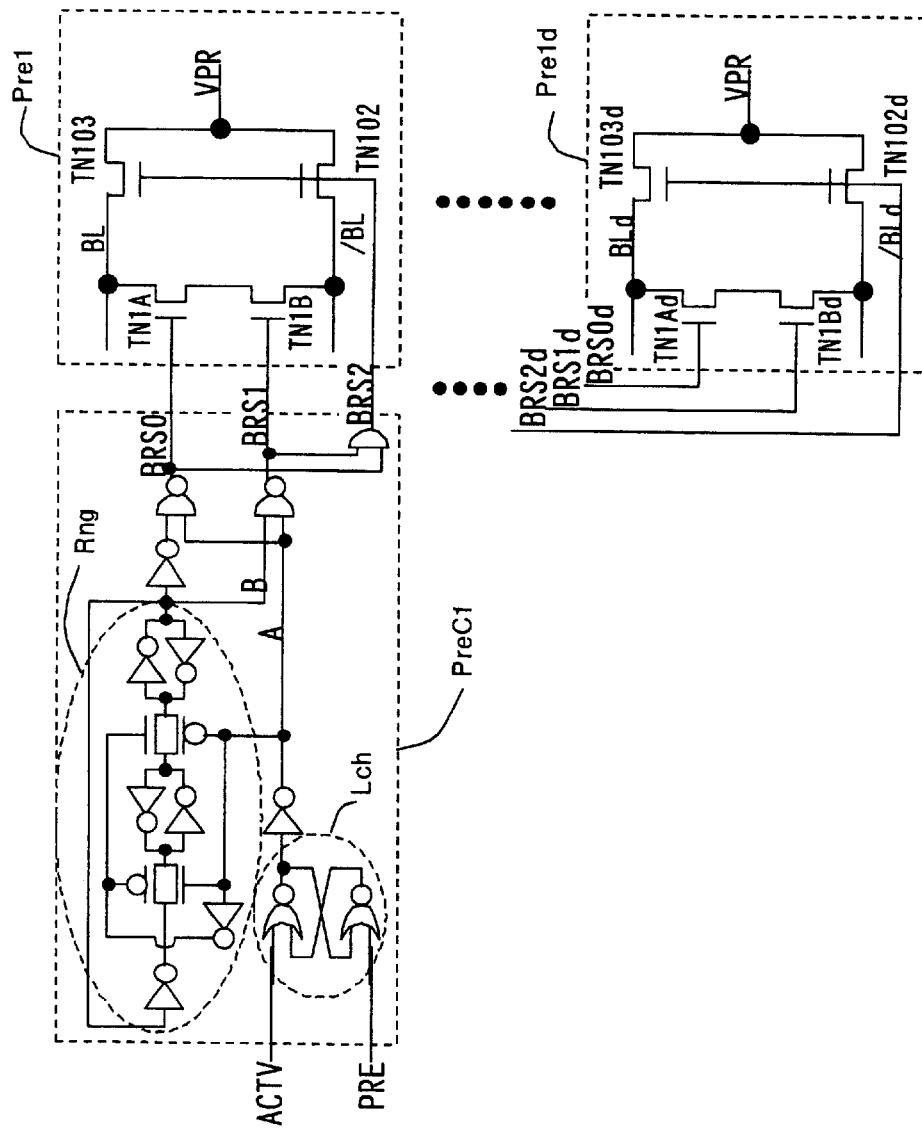
FIG. 4 is a schematic circuit diagram showing the bit line precharge circuit of the semiconductor memory device based on a first embodiment of this invention.

FIG. 4 for the first embodiment shows two of precharge circuits connected to bit line pairs which are precharged by a precharge signal generation circuit PreC1, i.e., a precharge circuit Pre1 which is connected to the bit line pair /BL-BL that are nearest to the precharge signal generation circuit PreC1 and a precharge circuit Pre1d which is connected to the bit line pair /BLd-BLd that are farthest from the precharge signal generation circuit PreC1.

These precharge circuits Pre1 and Pre1d operate to short the bit line pairs /BL-BL and /BLd-BLd, respectively, and hold the bit line voltage to a precharge voltage VPR during a data cycle in which data amplified by the sense amplifiers is transacted with some of the numerous memory cells (not shown) over the bit line pairs /BL-BL and /BLd-BLd.

The precharge circuit Pre1 (or Pre1d) has its shorting circuit section made up of NMOS transistors TN1A and TN1B (or TN1Ad and TN1Bd) which are connected in series between the bit lines and controlled by precharge signals BRS0 and BRS1 (or BRS0d and BRS1d), respectively, as will be explained later. The bit lines /BL and BL (or /BLd and BLd) are supplied with a certain precharge voltage VPR through NMOS transistors TN102 and TN103 (or TN102d and TN103d), respectively, so that these bit lines are held to the voltage VPR at precharging.

The precharge signal generation circuit PreC1 receives on its latch circuit Lch a data cycle start signal ACTV and precharge cycle start signal PRE which are produced in the form of pulses by the control circuit (not shown), thereby memorizing the state of operation cycle. The latch circuit Lch has its output inverted by an inverter, with the resulting signal A having a high level relative to the ACTV signal. The signal A goes to the output buffer and, at the same time, switches alternately a pair of transfer gates of a cycle demultiplying circuit Rng in a ring oscillator configuration, which then produces a signal B by halving the data cycle derived from the data cycle start signal ACTV and precharge cycle start signal PRE and delivers the signal B to the output buffer. The output buffer which is controlled by the signals A and B produces precharge signals BRS0 and BRS1.

The precharge signals BRS0 and BRS1 are fed to the precharge circuits Pre1 through Pre1d for the bit line pairs /BL-BL through /BLd-BLd. The signal path to the farthest precharge circuit Pre1d is long and has a significant line resistance. In addition, these lines are connected to NMOS transistors TN1A–TN1Ad and TN1B–TN1Bd, each having a gate capacitance, of the precharge circuits Pre1–Pre1d, and accordingly each line forms a CR delay circuit from the line resistance and load capacitance for each bit line. On this account, the precharge signals BRS0d and BRS1d received by the farthest circuit has a significant time lag relative to those of the nearest circuit.

Figure 5:
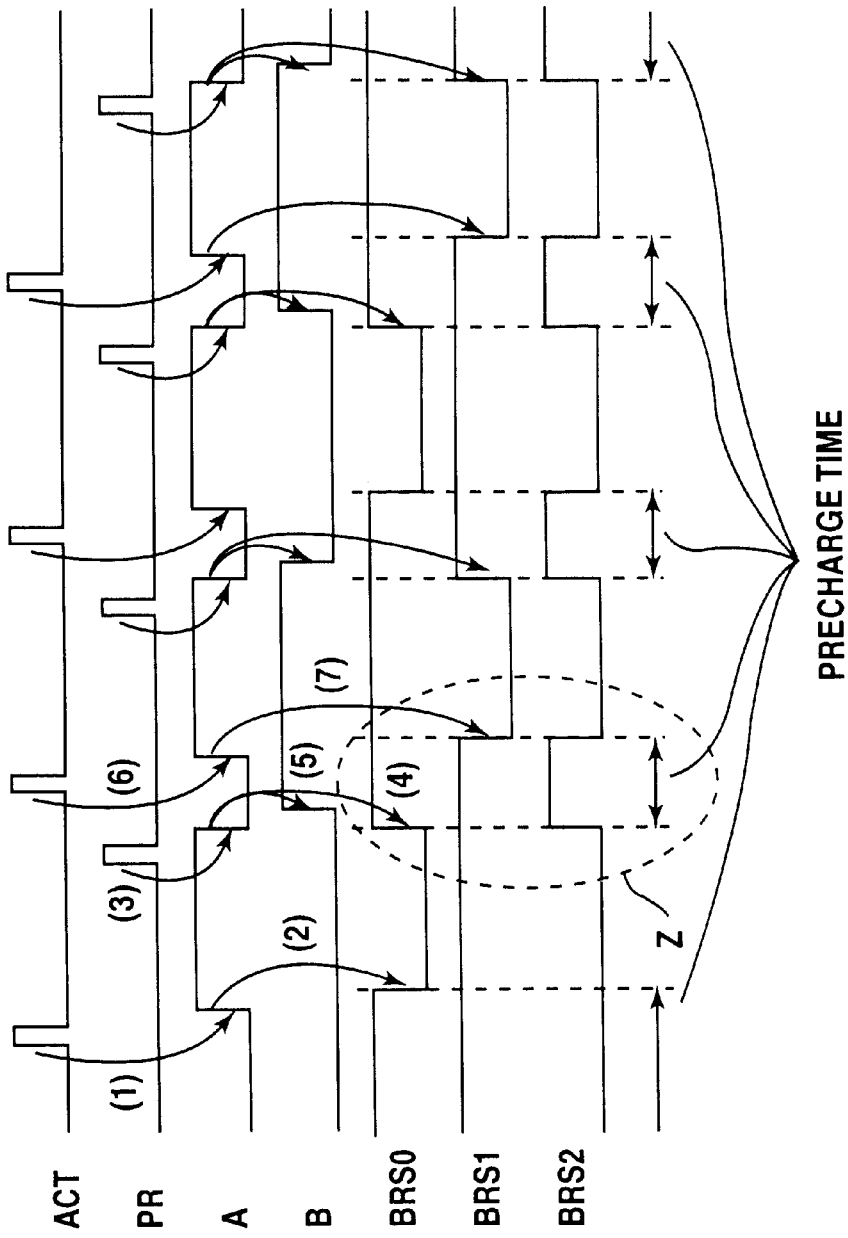
FIG. 5 is a waveform diagram showing the operation of the first embodiment in the case of a reduced bit line precharge time.

The data cycle start signal ACTV and precharge cycle start signal PRE are pulsative signals as shown in FIG. 5, and these signals are applied alternately thereby to short the bit line pair for precharging after a data access and before entering the next data cycle. The figure shows the operation with a reduced precharge time which is intended for speeding up the data cycle. Since the presence or absence of CR delay does not affect the fundamental circuit arrangement and operation, the following explains signals without CR delays unless otherwise mentioned.

The data cycle start signal ACTV is received by the latch circuit Lch of the precharge signal generation circuit PreC1, and the signal A is turned to the high level:(indicated by ① in FIG. 5). At this time, the signal B is assumed to have the low level, and the output buffer turns its output precharge signal BRS0 to the low level in response to the low-to-high transition of the signal A: (② in FIG. 5), whereas the precharge signal BRS1 stays at the high level, causing the transistor TN1B to become conductive to retain the preset state of the precharge operation for the next step. The signal A activates the former-stage transfer gate of the cycle demultiplying circuit Rng preparatory to the inversion of signal B in the next step.

At the reception of the precharge cycle start signal PRE on completion of the data cycle, the latch circuit Lch turns the signal A to the low level: (③ in FIG. 5), thereby turning the precharge signal BRS0 to the high level:(④ in FIG. 5). At the same time, the latter-stage transfer gate of the cycle demultiplying circuit Rng is becoming conductive, thereby turning the signal B to the high level: (⑤ in FIG. 5), while the signal A has turned to the low level, causing the precharge signal BRS1 to retain the high level. Consequently, the high-level precharge signals BRS0 and BRS1 make the transistors TN1A and TN1B conductive to start shorting of the bit line pair /BL-BL.

When the next data cycle begins at the reception of the data cycle start signal ACTV, the latch circuit Lch turns the signal A to the high level again (⑥ in FIG. 5), which turns the precharge signal BRS1 to the low voltage level again (⑦ in FIG. 5), thereby turning off the transistor TN1B, and the shorting operation of the bit line pair /BL-BL terminates. The precharge signal BRS0 retains the high level for the preset signal of the next precharge operation, thereby retaining the conductive state of the transistor TN1A.

The precharge cycle start signal PRE and data cycle start signal ACTV are received alternately to repeat the precharge operation. Another precharge signal BRS2 for driving transistors TN102 and TN103 for holding the voltage of the bit lines /BL and BL is produced from the logical product of the precharge signals BRS0 and BRS1, and it holds the bit lines /BL and BL at the precharge voltage VPR in synchronism with the shorting of the bit line pair /BL-BL.

In this manner, one of the precharge signals BRS0 and BRS1 is preset active since the former cycle of precharge operation and the other precharge signal is activated to start the shorting operation of the bit line pair /BL-BL, and the preset precharge signal is deactivated to terminate the shorting operation and the other precharge signal is kept active for the next precharge operation. Based on the alternate operations in data cycles, the shorting operation of bit line pair /BL-BL can be started and ended by the different control signals. Consequently, even if the precharge signals have their waveforms dulled due to the CR delay in the case of a reduced precharge time as a result of speed-up, the normal precharge operation is ensured in contrast to the case of control based on a single precharge signal. This circuit arrangement is less susceptible to the CR delay which is attributable to the line resistance of the precharge signals BRS0 and BRS1 and the gate capacitance of the load transistors TN1A and TN1B, whereby it becomes possible to reduce the shorting time of bit line pair /BL-BL thereby to accomplish the high-speed data access.

Figure 6:
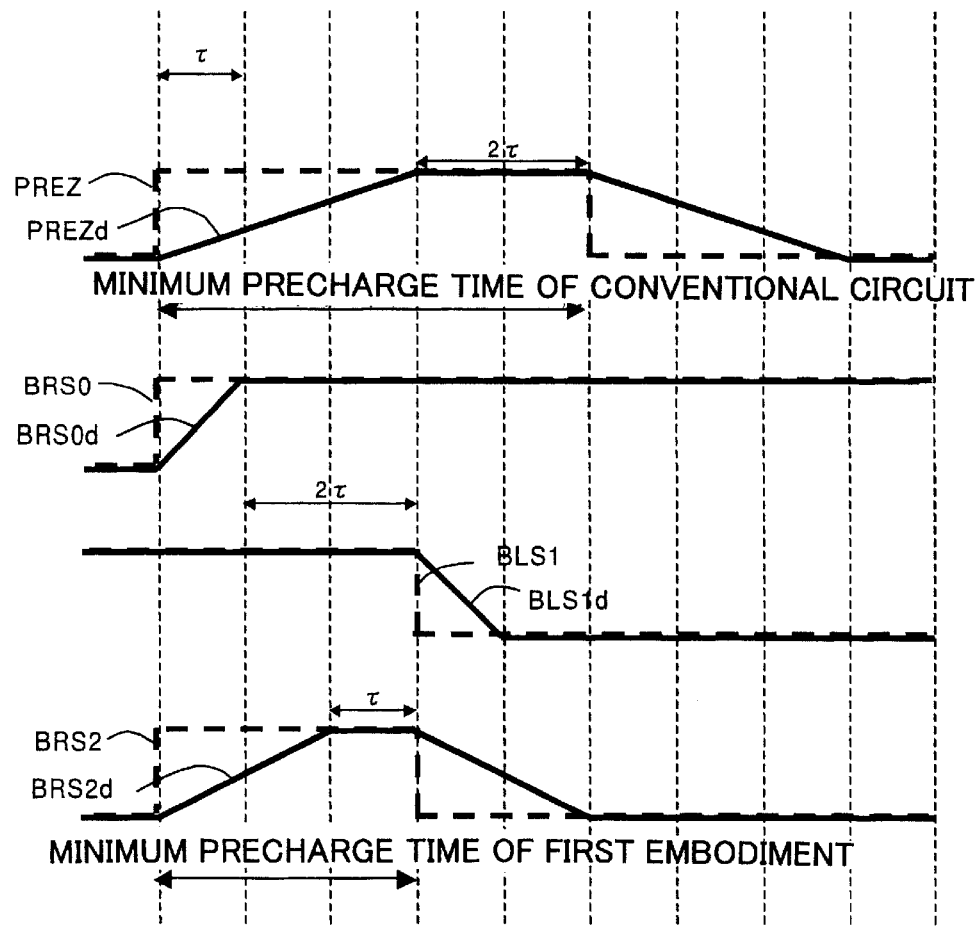
FIG. 6 is a waveform diagram showing in detail the operation of the first embodiment in the case of a reduced bit line precharge time due to the CR delay.

FIG. 6 showing the waveforms of the case of a reduced precharge time compares the precharge signal for the farthest precharge circuit Pre1d having the largest CR delay shown by Z in FIG. 5 with the precharge signal PREZ of the conventional circuit arrangement. For each bit line pair /BL-BL, the precharge signal BRS0 (or BRS1) has only one load transistor TN1Ad (or TN1Bd), which signifies the load reduction to ⅓ as compared with the conventional precharge signal PREZ which has three load transistors TN101 through TN103 (refer to FIG. 1). Assuming that the precharge signals BRS0d and BRS1d for the farthest precharge circuit Pre1d having a CR delay time of $\tau$ need a high-level period of $2\tau$ for the precharge operation, the minimum precharge time required to include a high-level period of $2\tau$ of both signals BRS0d and BRS1d and cover a rising delay of $\tau$ of the signal is a total of $3\tau$. In contrast, the conventional circuit arrangement having a 3-fold load has a CR delay time of $3\tau$ and accordingly the minimum precharge time required to include a $2\tau$ high-level period is $5\tau$.

The precharge operation actually begins at a voltage level lower than the high level of precharge signals, as it is determined from the threshold voltage of transistors, and accordingly the circuit arrangement of the first embodiment having a shorter CR delay time of the precharge signals BRS0d and BRS1d can further reduce the precharge time. The circuit arrangement of this embodiment can reduce the precharge time by at least $(5\tau-3\tau)/5\tau=40\%$. The precharge signal BRS2d having a CR delay of $2\tau$ can have a high-level voltage hold time of $\tau$.

Based on the use of the precharge circuit Pre1d for the farthest bit line pair /BLd-BLd having the largest CR delay which is driven by the 2-phase precharge signals BRS0d and BRS1d, the load capacitance of each of the signals BRS0d and BRS1d can be reduced and thus the signal transition time of the signals can be reduced, whereby the precharge time can be reduced by 40% or more.

Based on the shorting operation for the bit line pair /BL-BL with the 2-phase signals BRS0 and BRS1, these signals do not need to be narrow pulses, allowing the precharge signal generation circuit PreC1 to have a smaller drive power and thus have a smaller area on the chip and smaller power consumption.

Figure 7:
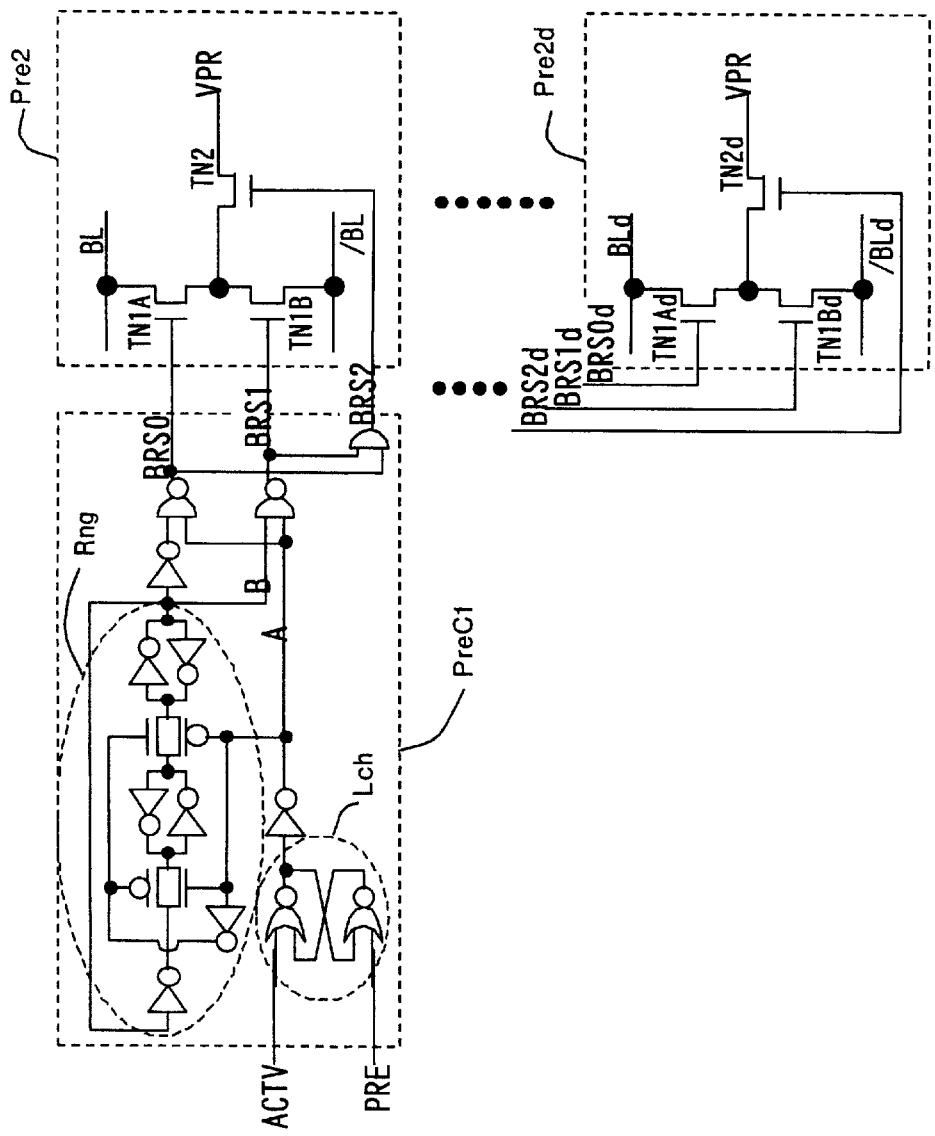
FIG. 7 is a schematic circuit diagram showing the bit line precharge circuit of the semiconductor memory device based on a second embodiment of this invention.

Next, the second embodiment of this invention will be explained with reference to FIG. 7 and FIG. 8. The precharge signal generation circuit PreC1 shown in FIG. 7 is identical to that of the first embodiment, and explanation thereof will be omitted. In place of the transistors TN102 and TN103 of the precharge circuit Pre1 of the first embodiment for holding the voltage of the bit lines /BL and BL, the precharge circuit Pre2 of this embodiment includes a transistor TN2 connected at the node of the precharge voltage VPR source and the transistors TN1A and TN1B which short the bit line pair /BL-BL.

The precharge signals BRS0 and BRS1 have virtually the same load condition as the case of the first embodiment, and controlling the shorting operation with the 2-phase signals ensures the operation even if the precharge signals BRS0 and BRS1 have their waveforms dulled due to the CR delay in the case of a reduced precharge time as a result of speed-up. This circuit arrangement is less susceptible to the CR delay which is attributable to the line resistance of the precharge signals BRS0 and BRS1 and the gate capacitance of the load transistors TN1A and TN1B, whereby it becomes possible to reduce the shorting time of bit line pair /BL-BL thereby to accomplish the high-speed data access. Moreover, the precharge signal BRS2 for holding the voltage of the bit lines /BL and BL has only the load transistor TN2 and therefore enables to speed up the voltage holding operation for the bit lines /BL and BL which thereby accomplishes the fast and ensured precharge operation in unison with the sped-up shorting operation for the bit line pair /BL-BL.

Figure 8:
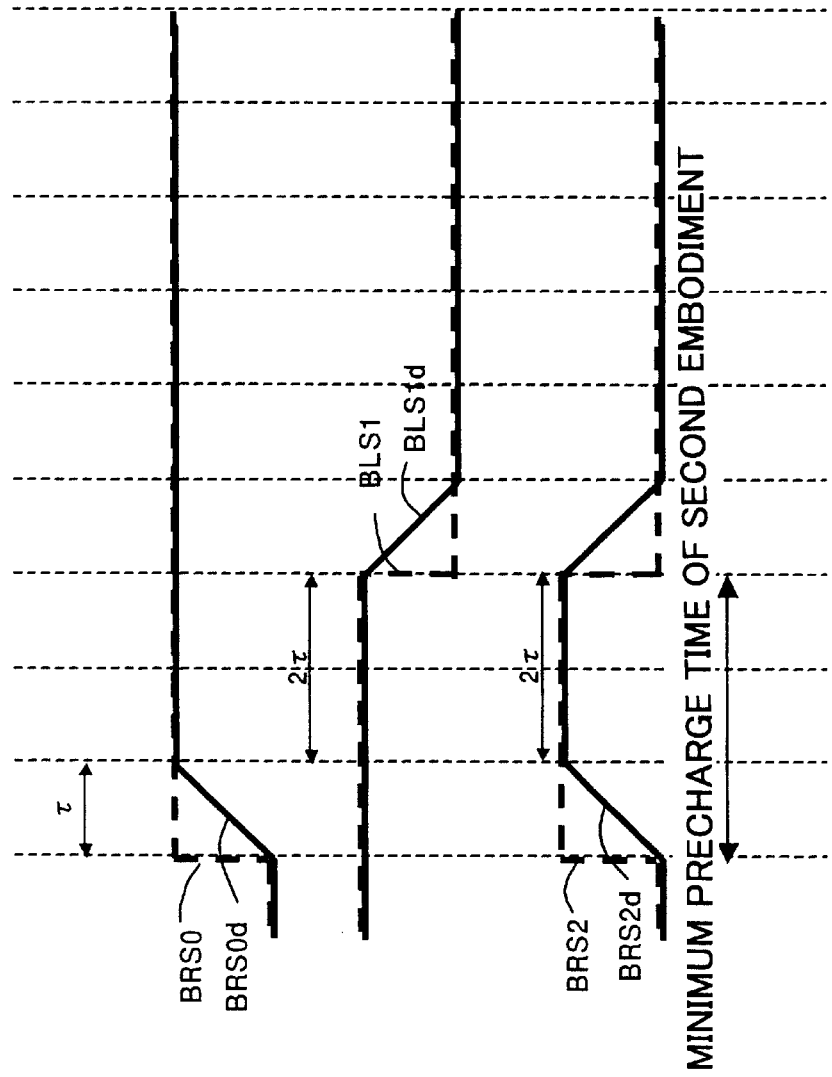
FIG. 8 is a waveform diagram showing in detail the operation of the second embodiment in the case of a reduced bit line precharge time due to the CR delay.

FIG. 8 shows the waveforms of the case of a reduced precharge time, showing the precharge signal for the farthest precharge circuit Pre2d which has the largest CR delay shown by Z in FIG. 5. The precharge signals BRS0d and BRS1d for the bit line pair /BLd-BLd have the same CR delay $\tau$ at signal transitions as the first embodiment, and the minimum precharge time required is 3τ. The precharge signal BRS2d for holding the voltage of bit lines /BLd and BLd can drive the transistor with a delay time of τ allowing the voltage holding time of 2τ. Actually, the precharge circuit Pre1d can operate at a voltage lower than the high level of the precharge signals BRS0d and BRS1d, and this embodiment having a shorter delay time at signal transitions can reduce the precharge time by 40% or more as compared with the conventional circuit arrangement, while having a sufficient voltage holding time for the bit lines /BLd and BLd.

Based on the 3-phase signals for the shorting operation of the bit line pair /BL-BL and the voltage holding operation for the bit lines /BL and BL, the individual precharge signals BRS0, BRS1 and BRS2 can have reduced loads. The precharge signals BRS0 and BRS1 do not need to be narrow pulses, allowing the precharge signal generation circuit PreC2 to have a smaller drive power and thus have a smaller area on the chip and smaller power consumption.

Next, the third embodiment of this invention will be explained with reference to FIG. 9 and FIG. 10. In place of the transistors TN102 and TN103 of the precharge circuit Pre1 of the first embodiment for holding the voltage of the bit lines /BL and BL, the precharge circuit Pre3 of this embodiment includes transistors TN2A and TN2B in series connection, with the TN2A having another end connected to the node of the transistors TN1A and TN1B which short the bit line pair /BL-BL and the TN2B having another end connected to the precharge voltage VPR source.

Among the four transistors TN1A, TN1B, TN2A and TN2B, the TN1A and TN2A and the TN1B and TN2B are each driven by being paired by the precharge signals BRS0 and BRS1, respectively. The transistor driving signals are based on the same logic as of the precharge signals BRS0 and BRS1 of the first embodiment, and therefore the precharge signal generation circuit PreC2 is derived from the circuit PreC1 of the first embodiment, with its circuit section for producing the precharge signal BRS2 being eliminated.

The precharge signals BRS0 and BRS1 which drive the transistors TN1A and TN1B for shorting the bit line pair /BL-BL has the same signal transition sequence as the case of the first embodiment, so that the shorting operation takes place during the period when both signals are at the high level as shown in FIG. 5. Accordingly, even if the precharge signals have their waveforms dulled due to the CR delay in the case of a reduced precharge time as a result of speed-up, the normal precharge operation is ensured. This circuit arrangement is less susceptible to the CR delay which is attributable to the line resistance of the precharge signals BRS0 and BRS1 and the gate capacitance of the load transistors TN1A and TN1B, whereby it becomes possible to reduce the shorting time of bit line pair /BL-BL thereby to accomplish the high-speed data access.

Moreover, the transistors TN2A and TN2B for holding the voltage of bit lines /BL and BL are arranged similarly to the transistors TN1A and TN1B and driven by the same precharge signals BRS0 and BRS1. Accordingly, in this embodiment, the bit line voltage holding operation takes place concurrently to the bit line shorting operation, and the precharge operation is controlled by the 2-phase precharge signals BRS0 and BRS1, in contrast to the first and second embodiments in which the 3-phase precharge signals BRS0, BRS1 and BRS2 are used.

Figure 10:
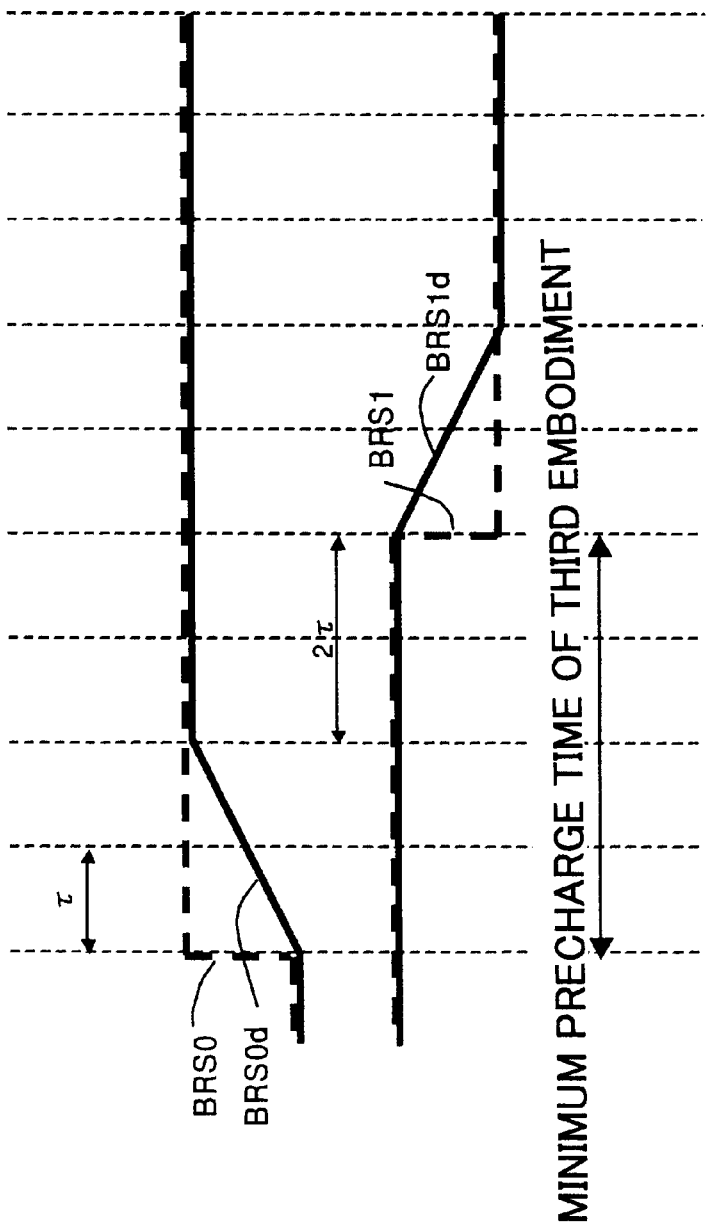
FIG. 10 is a waveform diagram showing in detail the operation of the third embodiment in the case of a reduced bit line precharge time due to the CR delay.

FIG. 10 shows operational waveforms of the case of a reduced prechargetime. Theprechargesignals BRS0d and BRS1d forthebitline pair /BLd-BLd have a CR delay 2τ at signal transitions, and in order to have a high-level period of 2τ for both signals, the minimum precharge time required becomes 4τ in which the shorting operation and voltage holding operation for the bit line pair /BLd-BLd take place concurrently. This is a reduction of precharge time by (5τ−4τ)/5τ=20% as compared with the conventional circuit arrangement. Actually, the precharge circuit Pre3d can operate at a voltage lower than the high level of precharge signals BRS0d and BRS1d, and this embodiment can reduce the precharge time by 20% or more as compared with the conventional circuit arrangement.

Based on the shorting operation for the bit line pair /BL-BL and the voltage holding operation for the bit lines /BL and BL with the 2-phase signals BRS0 and BRS1, these signals having reduced loads do not need to be narrow pulses, allowing the precharge signal generation circuit PreC2 to have a smaller drive power and thus have a smaller area on the chip and smaller power consumption.

Figure 11:
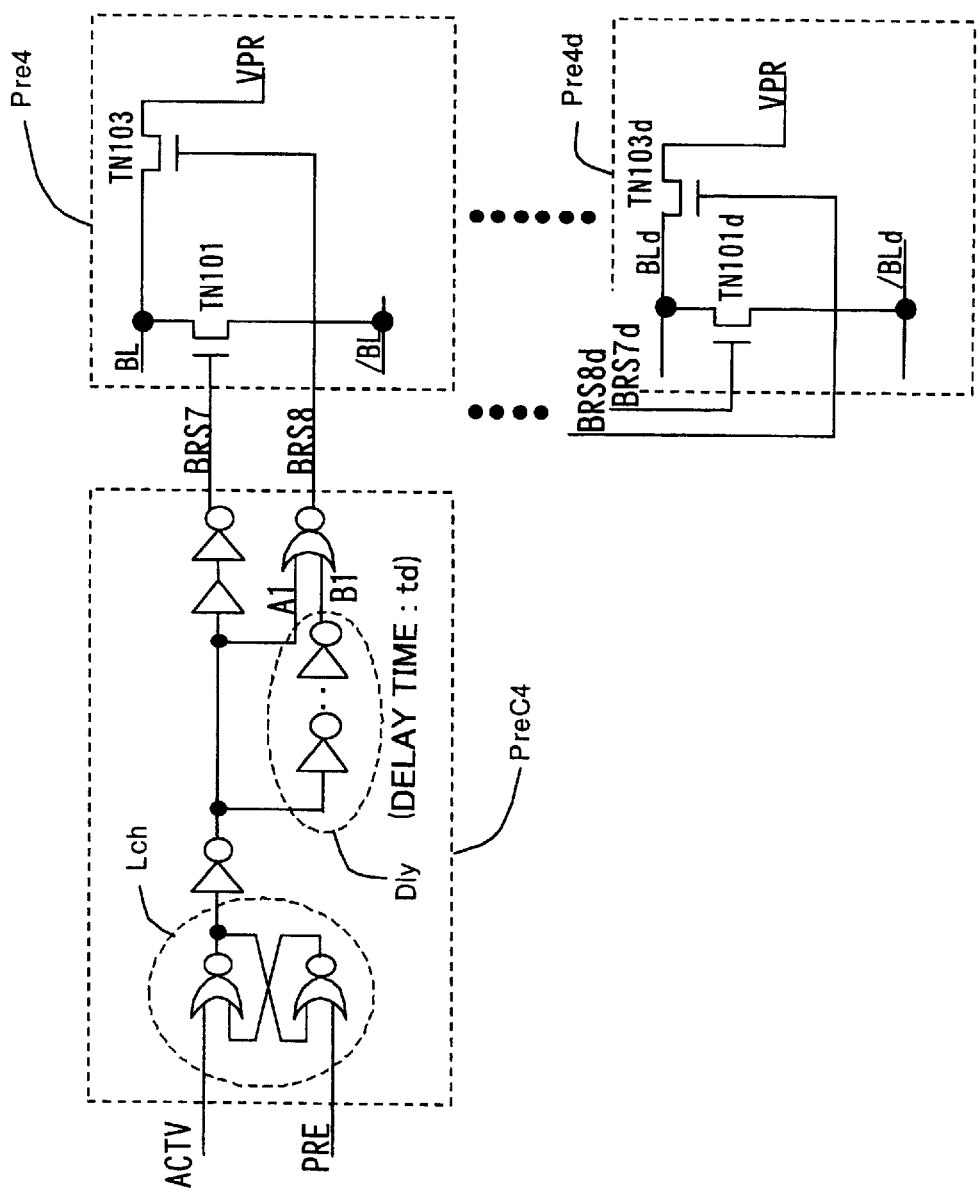
FIG. 11 is a schematic circuit diagram showing the bit line precharge circuit of the semiconductor memory device based on a fourth embodiment of this invention.

Next, the fourth embodiment of this invention will be explained with reference to FIG. 11 through FIG. 13. The precharge circuit Pre4 of this embodiment shown in FIG. 11 is derived from the conventional precharge circuit Pre, with the transistor TN102 which connects the bit line /BL directly to the VPR voltage source being eliminated.

The precharge signal generation circuit PreC4 receives on its latch circuit Lch a data cycle start signal ACTV and precharge cycle start signal PRE which are produced in the form of pulses by the control circuit (not shown), thereby memorizing the state of operation cycle, as in the cases of the preceding first through third embodiments.

The latch circuit Lch receiving the precharge cycle start signal PRE has its output inverted by an inverter to become a low-level signal A1, which is further inverted by the output buffer to become a high-level control signal BRS7. The BRS7 signal turns on the transistor TN101 to short the bit line pair. The inverted signal A1 is delayed by a delay time td by a delay circuit Dly, and a resulting delayed signal BI and the signal A1 undergo the NOR-logic operation to produce a high-level control signal BRS8 which is a delayed version of the control signal BRS7. The control signal BRS8 turns on the transistor TN103 to connect the bit lines /BL and BL to the VPR voltage source.

Figure 12:
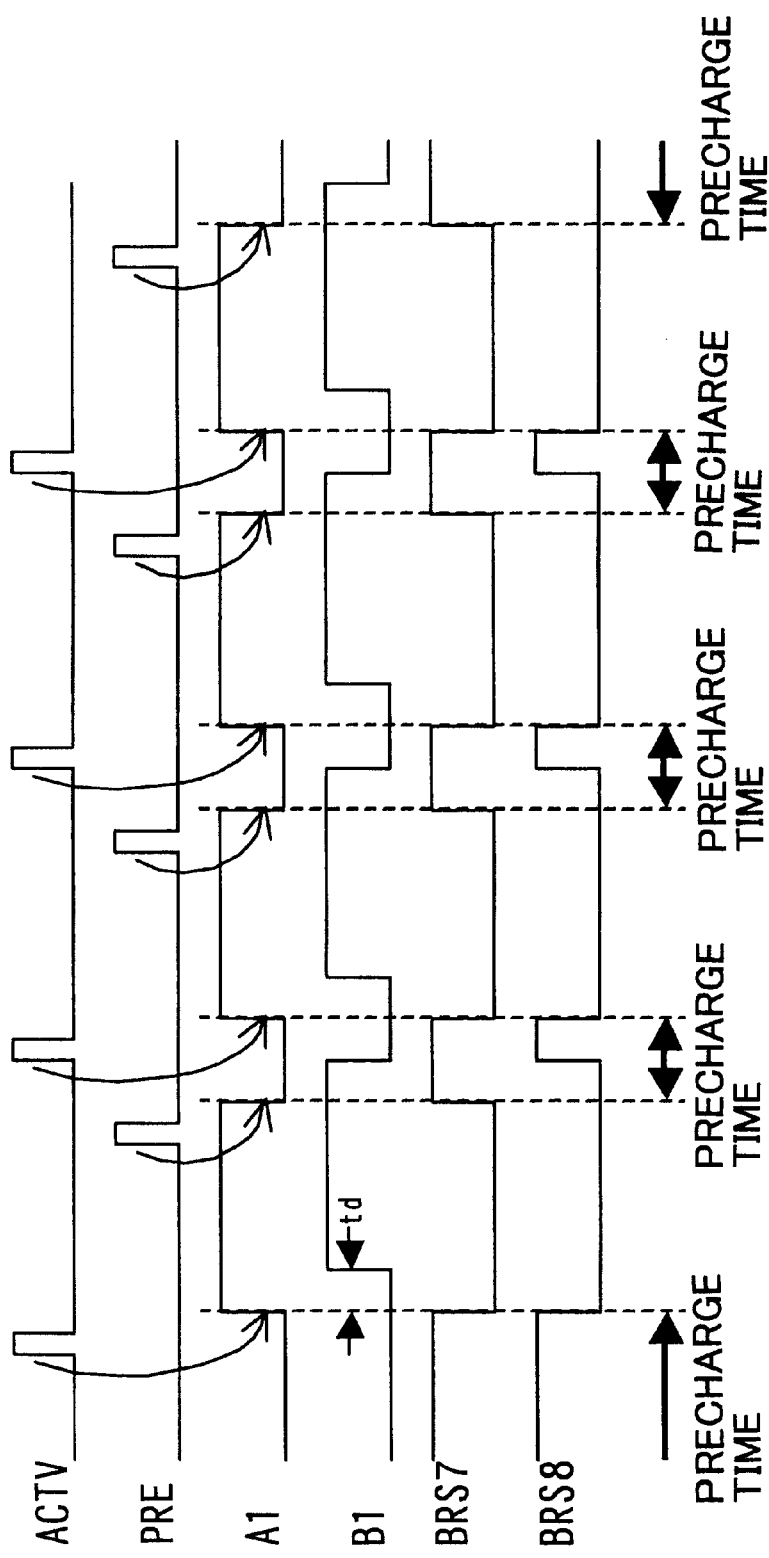
FIG. 12 is a waveform diagram showing the operation of the fourth embodiment in the case of a reduced bit line precharge time.

FIG. 12 shows the operational waveforms of the case of a reduced precharge time. The control signals BRS7 and BRS8 produced by the precharge signal generation circuit PreC4 are narrow pulses, however, each of these signals has only one load transistor for each bit line pair, and accordingly can deal with the farthest bit line pair of FIG. 11 with a sufficient operational margin in a reduced precharge time.

The control signal BRS8 for the transistor TN103 which holds the voltage of bit lines /BL and BL is activated after the delay time td relative to the control signal BRS7 for shorting the bit line pair /BL-BL. Based on the adjustment of the delay time td to the time taken for the bit line pair /BL-BL to be shorted enough so that the bit lines /BL and BL have virtually the same voltage, there is no difference in voltage holding operation in response to the control signal BRS8 between the line BL and the line /BL which are connected by the transistor TN103 directly or through the transistor TN101 to the VPR voltage source, and both bit lines /BL and BL can be held equally at the VPR voltage.

Figure 13:
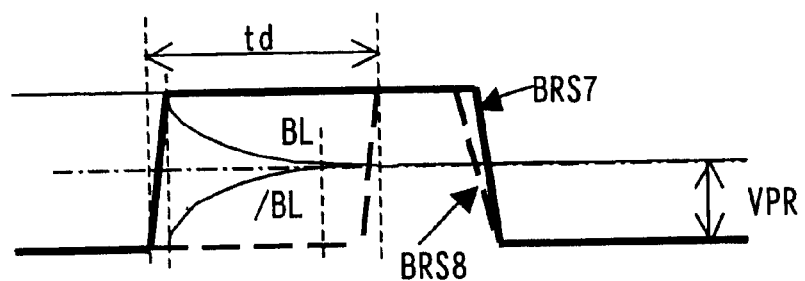
FIG. 13 is a waveform diagram showing the bit line shorting operation based on the fourth embodiment.

FIG. 13 shows the progress of shorting of the bit line pair /BL-BL and the control timing of the control signals BRS7 and BRS8. The figure shows that both bit lines /BL and BL can be held at the VPR voltage based on the application of the control signal BRS8 at the end of shorting of the bit line pair /BL-BL.

The bit lines /BL and BL are required to carry stored charge read out of a memory cell, with a small voltage difference appearing on the bit lines being amplified by the sense amplifier to form a bit of data. Therefore, it is necessary for the bit line pair /BL-BL to be within a certain voltage difference, and for this sake, a pair of bit lines /BL and BL must have their associated capacitive components balanced.

Figure 14:
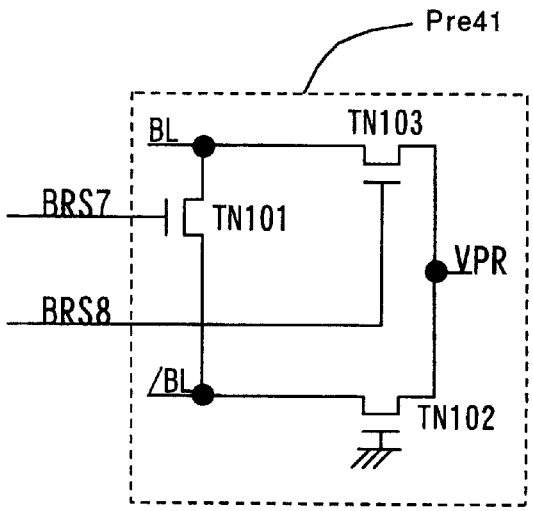
FIG. 14 is a schematic circuit diagram showing a first specific example of the bit line precharge circuit based on a fifth embodiment of this invention.
Figure 15:
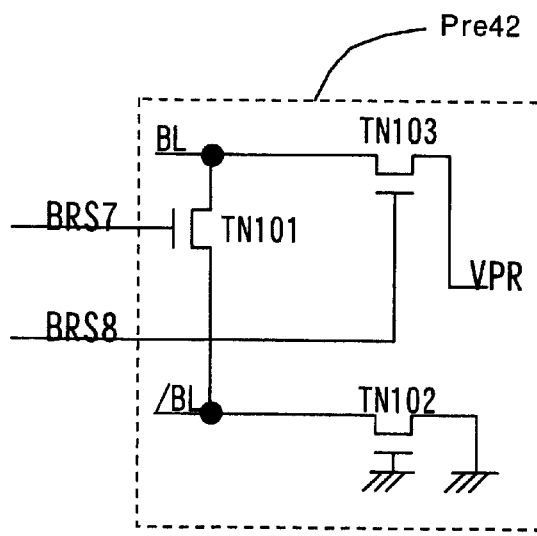
FIG. 15 is a schematic circuit diagram showing a second specific example of the bit line precharge circuit based on the fifth embodiment of this invention.

In dealing with this matter, FIG. 14 and FIG. 15 show two specific examples of the fifth embodiment of this invention, which is designed to connect a transistor TN102, which is of the same type as the transistor TN103, to the bit line /BL so that it is balanced in terms of the capacitance with the bit line BL having the connection of a capacitive load of the voltage holding transistor TN103.

The transistor TN102 connected to the bit line /BL is a dummy load which balances with the transistor TN103 connected to the bit line BL, and therefore it is kept non-conductive. In the first example shown in FIG. 14, a dummy NMOS transistor TN102 has its one end connected to the VPR voltage source and its gate connected to the ground so that it is kept non-conductive. In the second example shown in FIG. 15, the transistor TN102 has its one end and gate connected to the ground so that it is kept non-conductive. Both examples are solely intended to connect the transistor TN102 as a capacitive load to the bit line /BL thereby to balance with the voltage holding transistor TN103 in connection to the bit line BL.

Next, four specific examples of the sixth embodiment of this invention will be explained with reference to FIG. 16 through FIG. 19. This embodiment is intended to strengthen the shorting operation of the bit line pair /BL-BL by producing the precharge signals BRS0P, BRS1P, BRS3P and BRS4P from a voltage VPP which is stepped up from the bit line drive voltage so that the shorting transistors TN101, TN1A and TN1B have an increased drive power to achieve the faster switching operation.

The precharge signals BRS0P, BRS1P, BRS3P and BRS4P have their signal transition delay determined solely from the CR time constant of the line resistance and gate capacitance irrespective of the signal amplitude, and therefore the transition time since the conduction of the transistors TN101, TN1A and TNLB until the beginning of precharge operation is reduced by use of the step-up voltage VPP. For example, doubling the signal amplitude based on the step-up source voltage halves the delay time of the starting of operation. This scheme can further reduce the precharge time to speed up the data access. The following explains the first through fourth specific examples of this embodiment.

The first example shown in FIG. 16, which is derived from the conventional precharge circuit Pre of FIG. 1, is designed to use the step-up voltage VPP only for producing the precharge signal BRS3P which drives the transistor TN101 for shorting the bit line pair /BL-BL. The precharge signal generation circuit PreC3P is derived from the conventional circuit PreC, with its output buffer being split into two sections, of which one section has its output voltage level converted to VPP through a level shift circuit LShft1.

Consequently, the transistor TN101 which is driven by the stepped-up precharge signal BRS3P has increased driving power in proportion to the step-up voltage VPP and reduces the delay time to the beginning and ending of precharge operation, whereby the precharge time can be reduced. The voltage step-up circuit (not shown) supplies the VPP voltage only to the shorting transistor TN101, and accordingly suffices to have a smaller power capacity and thus have a smaller area on the chip and smaller power consumption.

The second example shown in FIG. 17, which is derived from the precharge circuit Pre1 of FIG. 4 of the first embodiment, is designed to use the step-up voltage VPP for producing the precharge signal BRS0P and BRS1P which drive the transistors TN1A and TN1B. The precharge signal generation circuit PreCIP has its output voltage level converted to the step-up voltage VPP by the provision of level shift circuits Lshift2 at its output stage to produce the precharge signals BRS0P and BRS1P.

The transistors TN1A and TN1B have increased driving power based on the step-up voltage VPP and reduce the delay time at the beginning and ending of precharge operation as in the case of the first example, whereby the precharge time can further be reduced owing to the combination with the first embodiment. The voltage step-up circuit supplies the VPP voltage only to the shorting transistors TN101 and TN102, and accordingly suffices to have a smaller area on the chip and smaller power consumption.

The third example shown in FIG. 18, which is derived from the precharge circuit Pre2 of FIG. 7 of the second embodiment, is designed to use the step-up voltage VPP for producing the precharge signal BRS0P and BRS1P which drive the transistors TN1A and TN1B. The precharge signal generation circuit PreC1P has the same arrangement as the second example.

The transistors TN1A and TN1B have increased driving power and reduce the operational delay time as in the case of the first and second examples, whereby the precharge time can further be reduced owing to the combination with the second embodiment. The voltage step-up circuit supplies the VPP voltage only to the shorting transistors TN101 and TN102, and accordingly suffices to have a smaller area on the chip and smaller power consumption.

Figure 9:
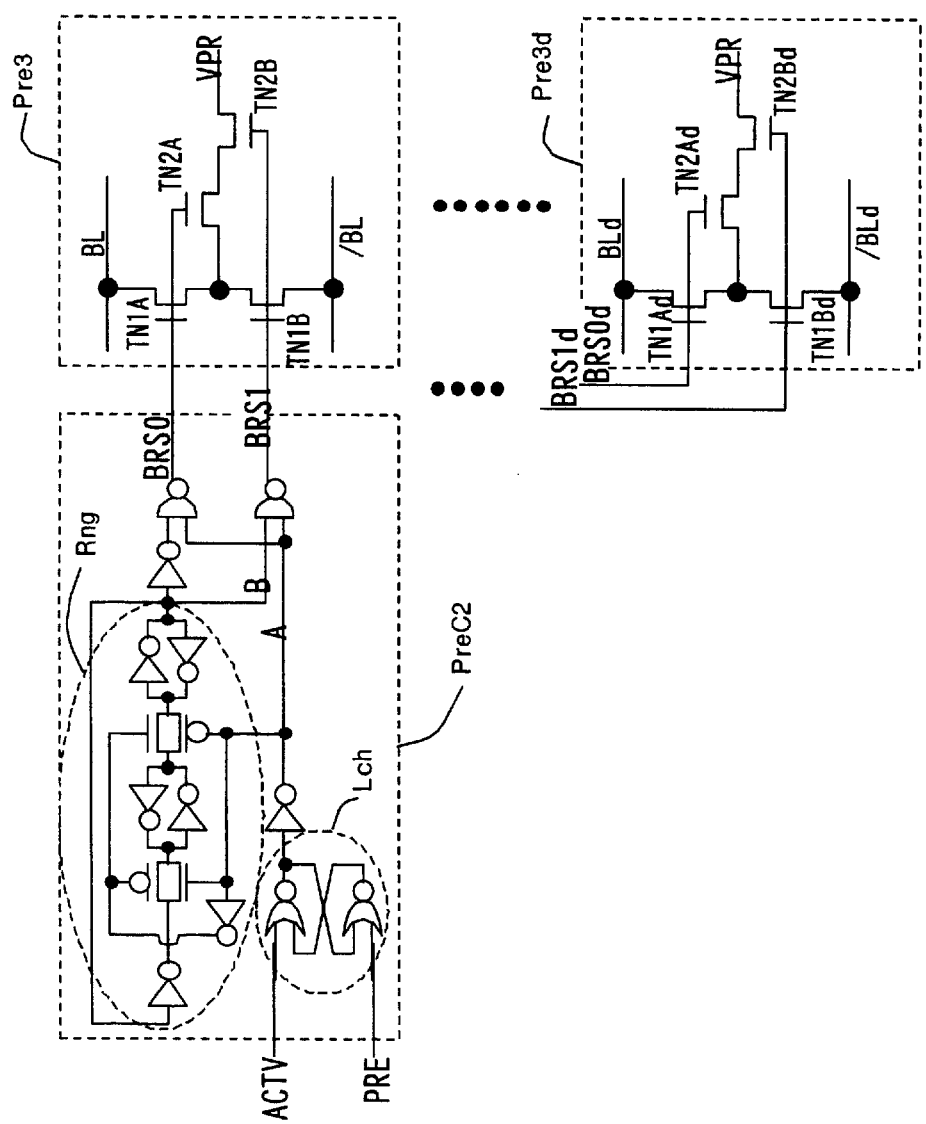
FIG. 9 is a schematic circuit diagram showing the bit line precharge circuit of the semiconductor memory device based on a third embodiment of this invention.

The fourth example shown in FIG. 19, which is derived from the precharge circuit Pre3 of FIG. 9 of the third embodiment, is designed to use the step-up voltage VPP for producing the precharge signals BRS0P and BRS1P which drive the transistors TN1A, TN1B, TN2A and TN2B. The precharge signal generation circuit PreC2P is derived from the circuit PreC2P of the third embodiment, with level shift circuits Lshift2 being added.

The fourth example is intended for speed-up based on the driving of all transistors TN1A, TN1B, TN2A and TN2B of the precharge circuit Pre3 by use of the step-up voltage VPP thereby to increase the driving power of transistors and reduce the delay time, whereby it is possible to speed up the shorting operation for the bit line pair /BL-BL and the voltage holding operation for the bit lines /BL and BL at the same time.

FIG. 20 shows the seventh embodiment of this invention, which is designed to control bit line pairs in two groups and also control precharge circuits PreN in two groups correspondingly, with the circuit groups being supplied with precharge signals BRS5 and BRS6, respectively.

Based on the operation of the precharge circuits PreN in two groups, each of the precharge signals BRS5 and BRS6 has its capacitive load halved, thereby reducing the CR delay time and thus reducing the precharge time, whereby the speed-up of data access can be accomplished.

This embodiment can be combined with each of the first through sixth embodiments so as to reinforce the effectiveness of each embodiment, and the precharge time can further be reduced to speed up the data access.

As described above in detail, the semiconductor memory device based on the first embodiment has its precharge circuit Pre1 designed to short a pair of bit lines /BL and BL through the NMOS transistors TN1A and TN1B in series connection which are controlled by the precharge signals BRS0 and BRS1, respectively, of which one of the precharge signals BRS0 and BRS1 is preset active since the former cycle of precharge operation, the other precharge signal is activated to start the shorting operation of the bit line pair /BL-BL, and the preset precharge signal is deactivated to terminate the shorting operation, and this circuit arrangement is less susceptible to the CR delay so that even if the precharge signals have their waveforms dulled due to the CR delay in the case of a reduced precharge time as a result of speed-up, the normal precharge operation is ensured, whereby it becomes possible to reduce the shorting time of bit line pair /BL-BL thereby to accomplish the speed-up of data access.

Based on the transistor driving with the 2-phase precharge signals BRS0 and BRS1, each signal can have a reduced capacitive load, resulting in a reduced delay of signal transitions, whereby the precharge time can be reduced by 40% or more.

Based on the shorting operation for the bit line pair /BL-BL with the 2-phase precharge signals BRS0 and BRS1 each having a reduced load, these signals do not need to be narrow pulses, allowing the precharge signal generation circuit PreC1 to have a smaller driving power and thus have a smaller area on the chip and smaller power consumption.

The semiconductor memory device based on the second embodiment has its precharge circuit designed to short a pair of bit lines /BL and BL through the transistors TN1A and TN1B in series connection as in the case of the first embodiment, and further include the transistor TN2 connected between the node of the transistors TN1A and TN1B and the power voltage VPR source and adapted to hold the voltage of the bit lines /BL and BL, with the 2-phase precharge signals BRS0 and BRS1 being used to control the bit line shorting operation as in the case of the first embodiment, and this circuit arrangement is less susceptible to the CR delay which is attributable to the line resistance of the signals and the gate capacitance of the transistors TN1A and TN1B, so that even if the precharge signals have their waveforms dulled due to the CR delay in the case of a reduced precharge time as a result of speed-up, the normal precharge operation is ensured, whereby it becomes possible to reduce the shorting time of bit line pair /BL-BL thereby to accomplish the speed-up of data access.

Based on the transistor driving with the 2-phase precharge signals BRS0 and BRS1, each signal can have a reduced capacitive load, resulting in a reduced delay of signal transition, as in the case of the first embodiment.

Furthermore, based on the independent supply of the precharge signal BRS2 for holding the voltage of the bit lines /BL and BL, the signal has only the load transistor TN2 which holds the voltage of the bit lines /BL and BL and therefore implements the voltage holding operation in a short precharge time, thereby accomplishing the fast and ensured precharge operation in unison with the sped-up shorting operation for the bit line pair /BL-BL, whereby the precharge time can be reduced by 40% or more.

Based on the shorting operation for the bit line pair /BL-BL and the voltage holding operation for the bit lines /BL and BL with the 3-phase signals BRS0, BRS1 and BRS2, these signals can have reduced loads and thus do not need to be narrow pulses, allowing the precharge signal generation circuit PreC1 to have a smaller driving power and thus have a smaller area on the chip and smaller power consumption.

The semiconductor memory device based on the third embodiment has its precharge circuit designed to include transistors TN2A and TN2B in series connection in place of the transistor TN2 of the second embodiment, with the transistors TN1A and TN2A and the TN1B and TN2B being driven by the precharge signals BRS0 and BRS1, respectively, and this circuit arrangement is less susceptible to the CR delay so that even if the precharge signals have their waveforms dulled due to the CR delay in the case of a reduced precharge time as a result of speed-up, the normal precharge operation is ensured, whereby it becomes possible to reduce the shorting time of bit line pair /BL-BL thereby to accomplish the speed-up of data access, as in the case of the first embodiment.

In addition, based on the synchronized driving of the bit line voltage holding transistors TN2A and TN2B with the driving of the transistors TN1A and TN1B, it is possible for the 2-phase precharge signals BRS0 and BRS1 to control concurrently the shorting operation for the bit line pair /BL-BL and the voltage holding operation for the bit lines /BL and BL.

Moreover, the precharge signals BRS0 and BRS1 each having a reduced load as compared with the conventional circuit arrangement can have a reduced delay time at signal transitions, whereby the precharge time can be reduced by 20% or more as compared with the conventional circuit arrangement.

Moreover, based on the shorting operation for the bit line pair /BL-BL and the voltage holding operation for the bit lines /BL and BL with the 2-phase signals BRS0 and BRS1, these signals can have reduced loads and thus do not need to be narrow pulses, allowing the precharge signal generation circuit PreC2 to have a smaller driving power and thus have a smaller area on the chip and smaller power consumption.

The semiconductor memory device based on the fourth embodiment has its precharge circuit designed to include transistors TN101 and TN103 which are derived from the conventional precharge circuit with the transistor TN102 being eliminated and with the transistors TN101 and TN103 being driven by the precharge signals BRS7 and BRS8, respectively. However, each of these signals has only one load transistor for each bit line pair, and accordingly can deal with the farthest bit line pair with a sufficient operational margin in a reduced precharge time.

In addition, the control signal BRS8 for the transistor TN103 which holds the voltage of bit lines /BL and BL is activated after the delay time td relative to the control signal BRS7 for shorting the bit line pair /BL-BL. Based on the adjustment of the delay time td to the time taken for the bit line pair /BL-BL to be shorted enough so that the bit lines /BL and BL have virtually the same voltage, there is no difference in voltage holding operation in response to the control signal BRS8 between the line BL and the line /BL which are connected by the transistor TN103 directly or through the transistor TN101 to the VPR voltage source, and both bit lines /BL and BL can be held equally at the VRP voltage.

The semiconductor memory device based on the fifth embodiment has its precharge circuit designed to add a transistor TN102, which is of the same type as the transistor TN103, to the bit line /BL so that it is balanced in terms of the capacitance with the bit line BL having the connection of a capacitive load of the voltage holding transistor TN103.

The transistor TN102 connected to the bit line /BL is a dummy load which balances with the transistor TN103 connected to the bit line BL, and therefore it is kept non-conductive, having its one end connected to the VPR voltage source and its gate connected to the ground, or having its one end and gate connected to the ground so that it is kept non-conductive.

Thus, the bit lines /BL and BL which are required to carry stored charge read out of a memory cell, with a small voltage difference appearing on the bit lines being amplified by the sense amplifier to form a bit of data, can be within a certain voltage difference, and have their associated capacitive components balanced.

The semiconductor memory device based on the sixth embodiment has its precharge signal generation circuit designed to produce the precharge signals BRS0P, BRS1P, BRS3P and BRS4P from the voltage VPP which is stepped up from the bit line driving voltage, so that the transistors TN101, TN1A and TN1B have an increased drive power and a shorter transition time at conduction, thereby having the faster switching operation. Specifically, the precharge signal BRS3P is produced from the step-up voltage VPP in the first example of this embodiment, and the precharge signals BRS0P and BRS1P are produced from the step-up voltage VPP in the second through fourth examples.

In the first through third examples, the load of step-up voltage VPP is confined to the transistor TN101 or TN1A and TN1B, allowing the voltage step circuit (not shown) to have a smaller power supply capacity and thus have a smaller area on the chip and smaller power consumption. In the fourth example, where all transistors TNLA, TN1B, TN2A and TN2B of the precharge circuit are driven by use of the step-up voltage VPP, it is possible to speed up the shorting operation and voltage holding operation of the precharge operation at the same time.

The semiconductor memory device based on the seventh embodiment is designed to control bit line pairs in two groups by the respective precharge signals BRS5 and BRS6, so that the signals have their loads halved as compared with the conventional circuit arrangement, thereby reducing the CR delay time and thus reducing the precharge time, whereby the speed-up of data access can be accomplished. This embodiment in combination with any of the first through sixth embodiments can further speed up the data access as a result of the reduced precharge time.

The present invention is not confined to the foregoing first through seventh embodiments, but various modifications and alterations are obviously possible within the scope of the substance of the invention.

For example, although the first through sixth embodiments are designed to implement the voltage holding operation for the bit lines /BL and BL in addition to the shorting operation for the bit line pair /BL-BL, if the holding of bit line voltage is not necessary in the precharge state as a result of sped-up data cycle, the precharge circuits of these embodiments may be designed solely to short the bit line pairs.

An alternative control scheme is to carry out only the shorting operation for the bit line pairs /BL-BL when continuous high-speed data access is requested, and add the voltage holding operation for the bit lines /BL and BL to the bit line shorting operation when the data access request is less frequent and the precharge state lasts longer. This control scheme is readily feasible for the first and second embodiments by use of the separate precharge signal for the voltage holding operation, and it can also be accomplished easily by the third embodiment by switching the common precharge signals with transfer gates or other logic circuit.

According to the present invention, the bit line shorting circuit is formed of two switching elements connected in series, which are controlled by control signals of different phases so that the shorting operation is immune to the CR delay, and the bit line shorting and voltage holding operations are controlled sequentially by two or more control signals so that each control signal has a reduced load, and the bit line shorting circuit is driven by a step-up voltage so that the precharge time is reduced, whereby it becomes possible for the semiconductor memory device to reduce the driving power of the control circuit so that it has a smaller area on the chip and smaller power consumption and accomplish the low-power and high-speed operation without increasing the circuit scale to meet trends toward the larger capacity, higher speed and, at the same time, the lower power voltage design of semiconductor memory devices.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A semiconductor memory device having, for each bit line pair, a bit line pair shorting circuit which shorts the bit line pair, and a bit line voltage holding circuit which holds the voltage of bit lines at a predetermined voltage, the bit line pair shorting circuit including a first and second switching elements which are connected in series between the bit lines of each bit line pair, the first and second switching elements being controlled by a first and second control signals, respectively, which do not have simultaneous signal level transitions.

2. A semiconductor memory device according to claim 1, wherein the bit line voltage holding circuit includes a third switching element which is connected between the common node of the first and second switching elements and a voltage source, the third switching element being controlled by a third control signal which becomes active within a period when both of the first and second switching elements are conductive to short the bit line pair.

3. A semiconductor memory device according to claim 1, wherein the bit line voltage holding circuit includes a third and fourth switching elements which are connected in series between the common node of the first and second switching elements and a voltage source, the third switching element being controlled by the first control signal which controls the first switching element, the fourth switching element being controlled by the second control signal which controls the second switching element.

4. A semiconductor memory device having, for each bit line pair, a bit line pair shorting circuit which shorts the bit line pair, and a bit line voltage holding circuit which holds the voltage of the bit lines at a predetermined voltage, the bit line pair shorting circuit including a first switching element which is connected between the bit lines of each bit line pair, the bit line voltage holding circuit including a second switching element which is connected between one bit line of the bit line pair and a voltage source, the first switching element being controlled by a first control signal, the second switching element being controlled by a second control signal which has a predetermined delay time relative to the first control signal.

5. A semiconductor memory device according to claim 4 further including a third switching element which is identical to the second switching element and is connected to the other bit line of the bit line pair, the third switching element being kept in the non-conductive state.

6. A semiconductor memory device according to claim 1, wherein the first and second control signals is driven by a voltage which is stepped up from the bit line pair driving voltage.

7. A semiconductor memory device according to claim 1, wherein a plurality of the bit line pair are divided into two or more groups, each group of bit line pairs undergoing the bit line pair shorting operation and the bit line voltage holding operation by being controlled by a control signal which is produced for each group separately.

8. A method of controlling a semiconductor memory device for shorting each bit line pair and holding the voltage of the bit lines at a predetermined voltage, the method producing a plurality of separate control signals from a control signal and controlling a series of operations beginning with the bit line pair shorting operation and ending with bit lines voltage holding operation sequentially based on the separate control signals.

9. A semiconductor memory device control method according to claim 8, wherein, in the bit line pair shorting operation, one separate control signal is activated to be preset for the shorting operation, another separate control signal is activated after a first delay time following the activation of the one separate control signal to begin the shorting operation, and the one separate control signal is deactivated after a second delay time following the activation of the another separate control signal to terminate the shorting operation.

* * * * *